(12) United States Patent
Frank et al.

(10) Patent No.: US 9,999,154 B2
(45) Date of Patent: Jun. 12, 2018

(54) FLASH MODULE

(71) Applicant: EMC IP Holding Company LLC, Hopkinton, MA (US)

(72) Inventors: Christopher Frank, Hopkinton, MA (US); Timothy Olesiewicz, Hopkinton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 129 days.

(21) Appl. No.: 15/339,085

(22) Filed: Oct. 31, 2016

(65) Prior Publication Data

US 2017/0049003 A1 Feb. 16, 2017

Related U.S. Application Data

(63) Continuation of application No. 14/530,596, filed on Oct. 31, 2014, now Pat. No. 9,603,280.

(Continued)

(51) Int. Cl.
*H05K 7/14* (2006.01)
*H05K 7/20* (2006.01)
(Continued)

(52) U.S. Cl.
CPC .......... *H05K 7/1489* (2013.01); *G11C 5/04* (2013.01); *G11C 5/14* (2013.01); *G11C 14/0018* (2013.01);

(Continued)

(58) Field of Classification Search
CPC ............. H05K 7/1489; H05K 7/20154; H05K 7/1492; H05K 7/1402; H05K 7/20436;
(Continued)

(56) References Cited

U.S. PATENT DOCUMENTS

D257,345 S 10/1980 Levy
D260,881 S 9/1981 McKinsey et al.
(Continued)

FOREIGN PATENT DOCUMENTS

DE 102006016743 A1 10/2007
EP 1420623 A1 5/2004
(Continued)

OTHER PUBLICATIONS

International Search Report for corresponding International Application PCT/US2014/065369, dated Mar. 11, 2015 (6 pages).

(Continued)

*Primary Examiner* — Michael C Zarroli
(74) *Attorney, Agent, or Firm* — Chamberlain Hrdlicka

(57) ABSTRACT

A system is disclosed that includes a flash module and a chassis. The flash module includes a top cover, a bottom cover, a printed circuit board, a capacitor, and a latch assembly. The latch assembly includes a housing having an opening and an inner cavity, a pull member, a reversing link, and a latch member. The chassis has an opening that is configured to receive the flash module. Also, the chassis includes a retaining pin coupled to the housing. The retaining pin protrudes into the inner cavity of the housing, and the second end of the latch member is configured to engage the retaining pin.

8 Claims, 17 Drawing Sheets

Related U.S. Application Data

(60) Provisional application No. 62/005,787, filed on May 30, 2014.

(51) Int. Cl.
*H05K 9/00* (2006.01)
*G11C 5/04* (2006.01)
*G11C 5/14* (2006.01)
*G11C 14/00* (2006.01)
*H05K 5/02* (2006.01)
*H05K 5/03* (2006.01)
*G06F 1/18* (2006.01)

(52) U.S. Cl.
CPC .......... *H05K 5/023* (2013.01); *H05K 5/0208* (2013.01); *H05K 5/0221* (2013.01); *H05K 5/03* (2013.01); *H05K 7/1402* (2013.01); *H05K 7/1492* (2013.01); *H05K 7/20154* (2013.01); *H05K 7/20436* (2013.01); *H05K 9/0007* (2013.01); *H05K 9/0049* (2013.01); *G06F 1/183* (2013.01)

(58) Field of Classification Search
CPC .. H05K 9/0007; H05K 5/0208; H05K 5/0221; H05K 5/023; H05K 5/03; H05K 9/0049; G11C 5/04; G11C 5/14; G11C 14/0018; G06F 1/183
See application file for complete search history.

(56) References Cited

U.S. PATENT DOCUMENTS

| | | |
|---|---|---|
| 4,648,066 A | 3/1987 | Pitt |
| 5,045,960 A | 9/1991 | Eding |
| 5,065,321 A | 11/1991 | Bezos et al. |
| D332,256 S | 1/1993 | Lewis |
| 5,214,550 A | 5/1993 | Chan |
| 5,253,129 A | 10/1993 | Blackborow et al. |
| 5,297,067 A | 3/1994 | Blackborow et al. |
| 5,301,346 A | 4/1994 | Notarianni et al. |
| 5,316,488 A | 5/1994 | Gardner et al. |
| 5,387,115 A | 2/1995 | Kozel et al. |
| 5,461,717 A | 10/1995 | Notarianni et al. |
| 5,519,573 A | 5/1996 | Cobb et al. |
| 5,570,270 A | 10/1996 | Naedel et al. |
| 5,691,860 A | 11/1997 | Hoppe |
| 5,701,894 A | 12/1997 | Cherry et al. |
| 5,764,480 A | 6/1998 | Crump et al. |
| 5,825,616 A | 10/1998 | Howell et al. |
| D408,379 S | 4/1999 | McGraw et al. |
| 6,083,018 A | 7/2000 | Hara et al. |
| 6,137,759 A | 10/2000 | Ogiro et al. |
| 6,174,180 B1 | 1/2001 | Chen |
| 6,185,103 B1 | 2/2001 | Yamada |
| 6,222,727 B1 | 4/2001 | Wu |
| 6,324,062 B1 | 11/2001 | Treiber et al. |
| 6,324,075 B1 | 11/2001 | Unrein et al. |
| 6,359,778 B1 | 3/2002 | Wu |
| 6,373,696 B1 | 4/2002 | Bolognia et al. |
| 6,388,884 B1 | 5/2002 | Greco et al. |
| 6,396,704 B1 | 5/2002 | White |
| 6,654,235 B2 | 11/2003 | Imsand |
| 6,683,785 B1 | 1/2004 | Chen |
| 6,953,232 B2 | 10/2005 | Busby et al. |
| 6,987,927 B1 | 1/2006 | Battaglia et al. |
| 7,023,704 B1 | 4/2006 | Zarnowitz et al. |
| 7,088,579 B1 | 8/2006 | Konshak |
| 7,242,576 B2 | 7/2007 | Coster et al. |
| 7,251,145 B1 | 7/2007 | Reznikov |
| 7,301,776 B1 | 11/2007 | Wang et al. |
| 7,362,566 B1 | 4/2008 | Sivertsen |
| 7,396,244 B1 | 7/2008 | Barna et al. |
| 7,499,286 B2 | 3/2009 | Berke et al. |
| 7,719,855 B2 | 5/2010 | Berke et al. |
| 7,944,691 B1 | 5/2011 | Pounds |
| 8,514,565 B2 | 8/2013 | Foo et al. |
| D698,792 S | 2/2014 | Lin et al. |
| 8,657,983 B2 | 2/2014 | Singleton |
| 8,737,067 B1 | 5/2014 | Kim et al. |
| 8,760,859 B2 | 6/2014 | Fuchs et al. |
| 8,897,006 B2 | 11/2014 | Ito et al. |
| 8,969,816 B2 | 3/2015 | Caruba et al. |
| 9,164,555 B2 | 10/2015 | Soffer |
| 9,250,229 B2 * | 2/2016 | Holmes .................. G01N 35/00 |
| 9,395,772 B2 | 7/2016 | Degner et al. |
| 2002/0018423 A1 | 2/2002 | Goble |
| 2002/0030927 A1 | 3/2002 | Kimura et al. |
| 2002/0033890 A1 | 3/2002 | Nicklos et al. |
| 2002/0114254 A1 | 8/2002 | Ohgaki |
| 2002/0122295 A1 | 9/2002 | Laing |
| 2002/0169912 A1 | 11/2002 | Mills et al. |
| 2002/0182896 A1 | 12/2002 | Welsh et al. |
| 2003/0041203 A1 | 2/2003 | Jones et al. |
| 2003/0136849 A1 | 7/2003 | Adelmann |
| 2003/0161199 A1 | 8/2003 | Estakhri |
| 2004/0057702 A1 | 3/2004 | Battaglia et al. |
| 2004/0213141 A1 | 10/2004 | Lin |
| 2004/0228184 A1 | 11/2004 | Mathiowetz |
| 2004/0233629 A1 | 11/2004 | Wang et al. |
| 2004/0242041 A1 | 12/2004 | Ngo |
| 2005/0018397 A1 | 1/2005 | Kay et al. |
| 2005/0259395 A1 | 11/2005 | Espinoza-Ibarra et al. |
| 2006/0030080 A1 | 2/2006 | Hsueh et al. |
| 2006/0061955 A1 | 3/2006 | Imblum |
| 2006/0072239 A1 | 4/2006 | Iftikar |
| 2006/0146441 A1 | 7/2006 | Chih |
| 2007/0070669 A1 | 3/2007 | Tsem |
| 2007/0217171 A1 | 9/2007 | Le |
| 2007/0274032 A1 | 11/2007 | Ni et al. |
| 2007/0274039 A1 | 11/2007 | Hamlin |
| 2007/0293137 A1 | 12/2007 | Crippen et al. |
| 2008/0002348 A1 | 1/2008 | Kim et al. |
| 2008/0094799 A1 | 4/2008 | Zieman et al. |
| 2008/0112125 A1 | 5/2008 | Martin et al. |
| 2008/0218949 A1 | 9/2008 | Hughes |
| 2008/0218957 A1 | 9/2008 | Kim et al. |
| 2008/0225479 A1 | 9/2008 | Zieman et al. |
| 2008/0266779 A1 | 10/2008 | Thomas et al. |
| 2008/0298009 A1 | 12/2008 | Weng et al. |
| 2008/0298014 A1 | 12/2008 | Franco |
| 2008/0310107 A1 | 12/2008 | Vinson et al. |
| 2008/0316704 A1 | 12/2008 | Vinson et al. |
| 2009/0016019 A1 | 1/2009 | Bandholz et al. |
| 2009/0034349 A1 | 2/2009 | Miura |
| 2009/0086456 A1 | 4/2009 | Milo et al. |
| 2009/0100217 A1 | 4/2009 | Battaglia et al. |
| 2009/0109619 A1 | 4/2009 | Wise et al. |
| 2009/0135558 A1 | 5/2009 | Hughes |
| 2009/0147462 A1 | 6/2009 | Zhu et al. |
| 2009/0154098 A1 | 6/2009 | Nguyen |
| 2009/0172279 A1 | 7/2009 | Yuan et al. |
| 2009/0185355 A1 | 7/2009 | Zhu et al. |
| 2009/0198927 A1 | 8/2009 | Bondurant et al. |
| 2009/0210636 A1 | 8/2009 | Karamcheti et al. |
| 2009/0257191 A1 | 10/2009 | Ecker et al. |
| 2009/0279243 A1 | 11/2009 | Amidi et al. |
| 2010/0002382 A1 | 1/2010 | Aybay et al. |
| 2010/0014248 A1 | 1/2010 | Boyden et al. |
| 2010/0142243 A1 | 6/2010 | Baxter |
| 2010/0323757 A1 | 12/2010 | Seflic et al. |
| 2010/0328886 A1 | 12/2010 | Nguyen |
| 2010/0332711 A1 | 12/2010 | Li et al. |
| 2011/0080701 A1 | 4/2011 | Bisson et al. |
| 2011/0153903 A1 | 6/2011 | Hinkle et al. |
| 2011/0222234 A1 | 9/2011 | Davis et al. |
| 2011/0261521 A1 | 10/2011 | Lo |
| 2011/0292588 A1 | 12/2011 | Seeley |
| 2012/0010754 A1 | 1/2012 | Matteson |
| 2012/0050986 A1 | 3/2012 | Riebel |
| 2012/0120596 A1 | 5/2012 | Bechtolsheim |
| 2012/0233402 A1 | 9/2012 | Laaksonen et al. |
| 2012/0278534 A1 | 11/2012 | Sun et al. |
| 2012/0327597 A1 | 12/2012 | Liu et al. |

(56) References Cited

U.S. PATENT DOCUMENTS

| | | | |
|---|---|---|---|
| 2013/0054862 A1 | 2/2013 | Tsai | |
| 2013/0107424 A1 | 5/2013 | Thomas et al. | |
| 2013/0107443 A1 | 5/2013 | Kim et al. | |
| 2013/0148287 A1 | 6/2013 | Chang | |
| 2013/0163175 A1 | 6/2013 | Kim et al. | |
| 2013/0176676 A1 | 7/2013 | Keffeler et al. | |
| 2013/0176677 A1 | 7/2013 | Rust et al. | |
| 2013/0342989 A1 | 12/2013 | Singleton | |
| 2014/0078660 A1 | 3/2014 | Dondzik et al. | |
| 2014/0087787 A1 | 3/2014 | Rivera-Sanchez | |
| 2015/0288801 A1 | 10/2015 | Fishman et al. | |

FOREIGN PATENT DOCUMENTS

| | | |
|---|---|---|
| EP | 2275913 A1 | 1/2011 |
| JP | 06-309860 A | 4/1994 |
| WO | 03063560 A2 | 7/2003 |
| WO | 2005029936 A1 | 3/2005 |
| WO | 2007056669 A2 | 5/2007 |
| WO | 2008103359 A1 | 8/2008 |
| WO | 2009015285 A1 | 1/2009 |
| WO | 2013029264 | 3/2013 |

OTHER PUBLICATIONS

Press Release, "3M Introduces New CompactFlash brand Type II Card Ejectors for Long Guide CFII Headers," 3M News, www.3M.com, Jul. 6, 2006 (2 pages).

Doug Hoy, "Delphi Connection Systems Adds to Growing Portfolio with Introduction of PCI Express(TM), DDR2-DIMM Series; Computing Products' Availability Announced During Appearance at IDF.," PR Newswire, http://www.thefreelibrary.com/Delphi+Connection+Systems...s+to+Growing+Portfolio+with+Intruction...-a0121678034, Sep. 7, 2004 (4 pages).

StarTech.com, "Removable 2.5" SATA HDD Enclosure/Backup System/Mobile Rack for 3.5/5.25" Bay", Product ID: SAT2510U3REM, http://www.startech.com/HDD/Mobile-Racks/Removable-Hard-Drive-Enclosure-Backup-System-SAT2510U3REM, date accessed Apr. 16, 2014 (3 pages).

PC Support Services Ltd., "The Saturn Mobile Rack", http://www.pcssl.co.nz/documents/prodinfo/addonics/Saturn%20and%20Cipher/MobileRack.htm, dated accessed Apr. 16, 2014 (5 pages).

Icy Dock, "EZ-Fit MB990SP-B Tool-less Dual 2.5" SSD/HDD Mounting Kit / Bracket", http://www.icydock.com/goods.php?id=79, date accessed Apr. 16, 2014 (3 pages).

"Removable Memory Cartridge Houses 2.5-Inch SATA Drives", http://www.cotsjournalonline.com/articles/view/103844, date accessed Apr. 16, 2014 (1 page).

Tapeonline.com, "Imation RDX 500GB Removable Cartridge", http://www.tapeonline.com/products/imation-rdx-rdx-500gb-removable-cartridge, date accessed Apr. 16, 2014 (2 pages).

"Quantum RDX", Quantum Datasheet, http://www.quantum.com/products/removablediskdrives/rdx/index.aspx, date accessed Apr. 16, 2014 (2 pages).

Plastiras, Elias, "HP Z1 workstation (B4F79PA) review", PC World, http://www.pcworld.idg.com.au/review/hp/z1_workstation_b4f79pa_review/426935/, Jul. 6, 2012 (12 pages).

"CWC Debuts Low-Cost Rugged, Removable Solid State Memory Module Carrier", http://www.unmannedsystemstechnology.com/2013/12/cwc-debuts-low-cost-rugged-removable-solid-state-memory-module-carrier/, dated Dec. 19, 2013 (2 pages).

Curtiss-Wright, "Curtiss-Wright Acquired Parvus Corporation, Extends Curtiss-Wright's Capabilities in Rugged Small Form Factor Computing and Communications Subsystems", http://www.parvus.com/product/overview.aspx?prod=RuggedRemovableMassStorage, date accessed Apr. 15, 2014 (2 pages).

Curtiss-Wright, Press Release, "Curtiss-Wright Controls Introduces Rugged Cartridges for Standard High-Density SATA Solid State Drives", http://news.thomasnet.com/fullstory/Rugged-Cartridges-facilitate-removeable-SATA-SSD-deployment-20019299, dated Dec. 12, 2013 (7 pages).

Synchrotech, "PCMCIA ATA Flash PC Cards FMJ Industrial", http://www.synchrotech.com/products/ata-flash-pcmcia-memory-pc_cards_12-fmj-industrial.html, date accessed Apr. 15, 2014 (2 pages).

Molex, "CompactFlash™", http://www.molex.com/molex/products/family?channel=products&chanName=family&key=compactflash, date accessed Apr. 15, 2014 (5 pages).

Written Opinion of the International Searching Authority for corresponding International Application No. PCT/US2014/065369, dated Mar. 11, 2015 (6 pages).

* cited by examiner

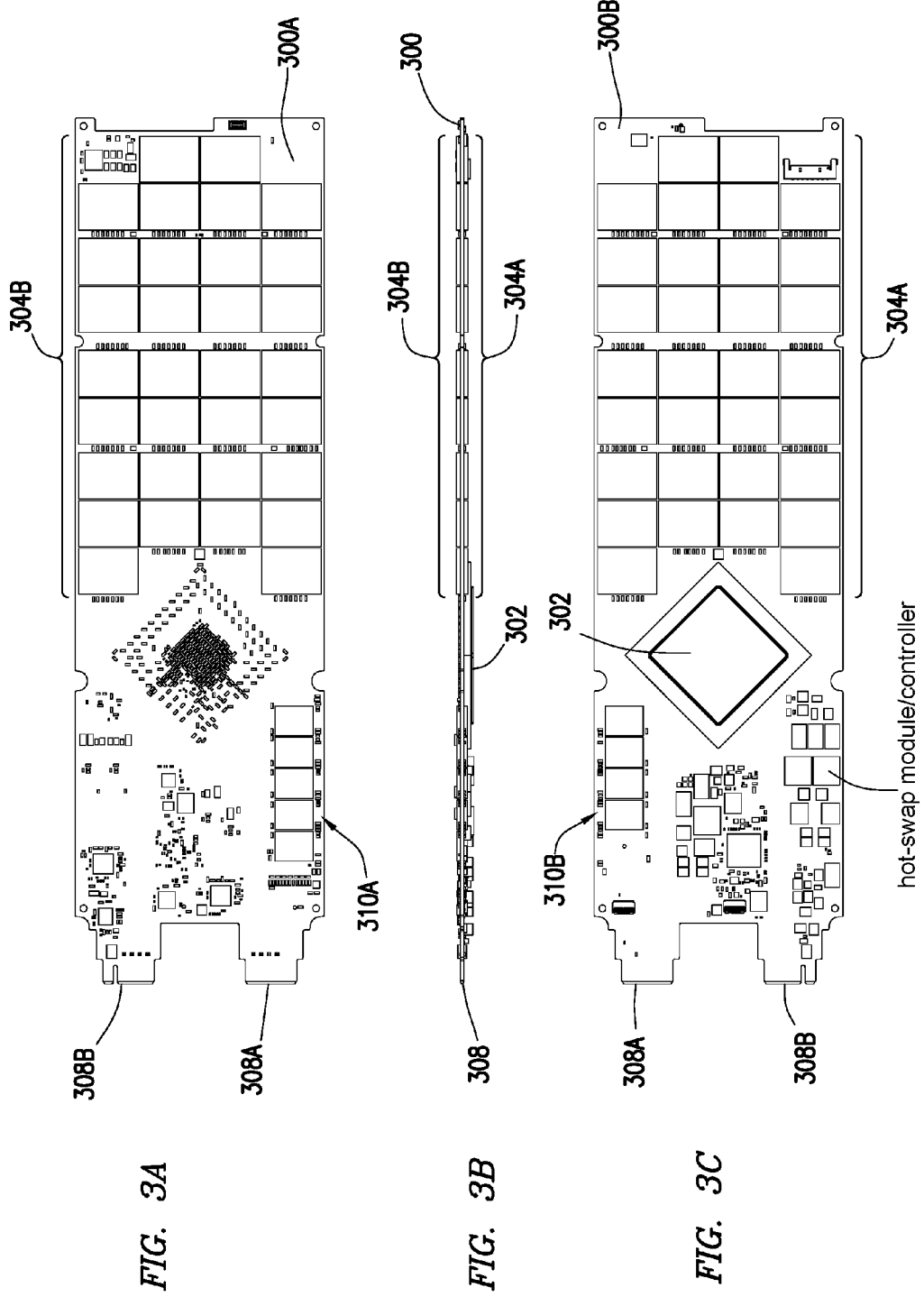

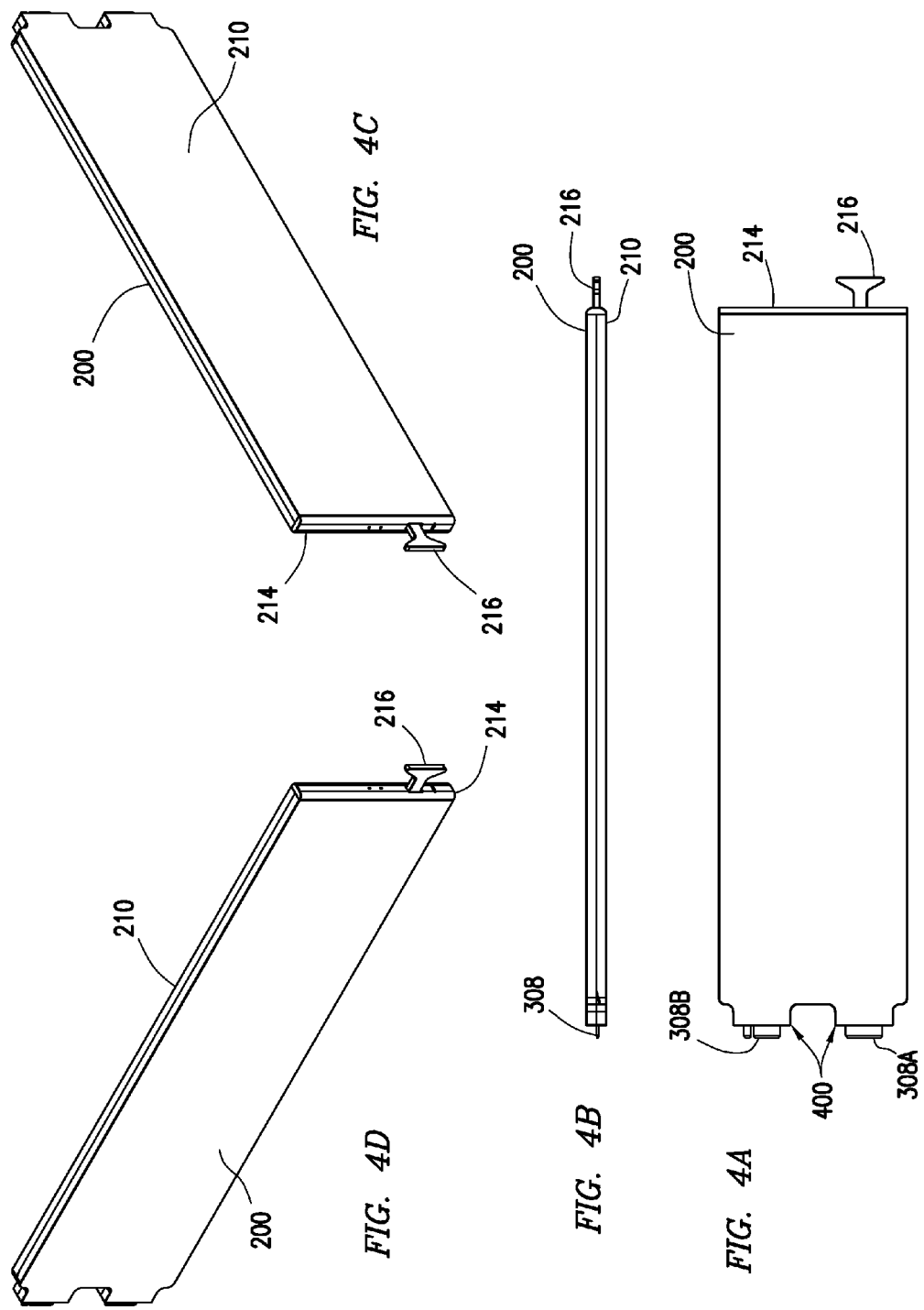

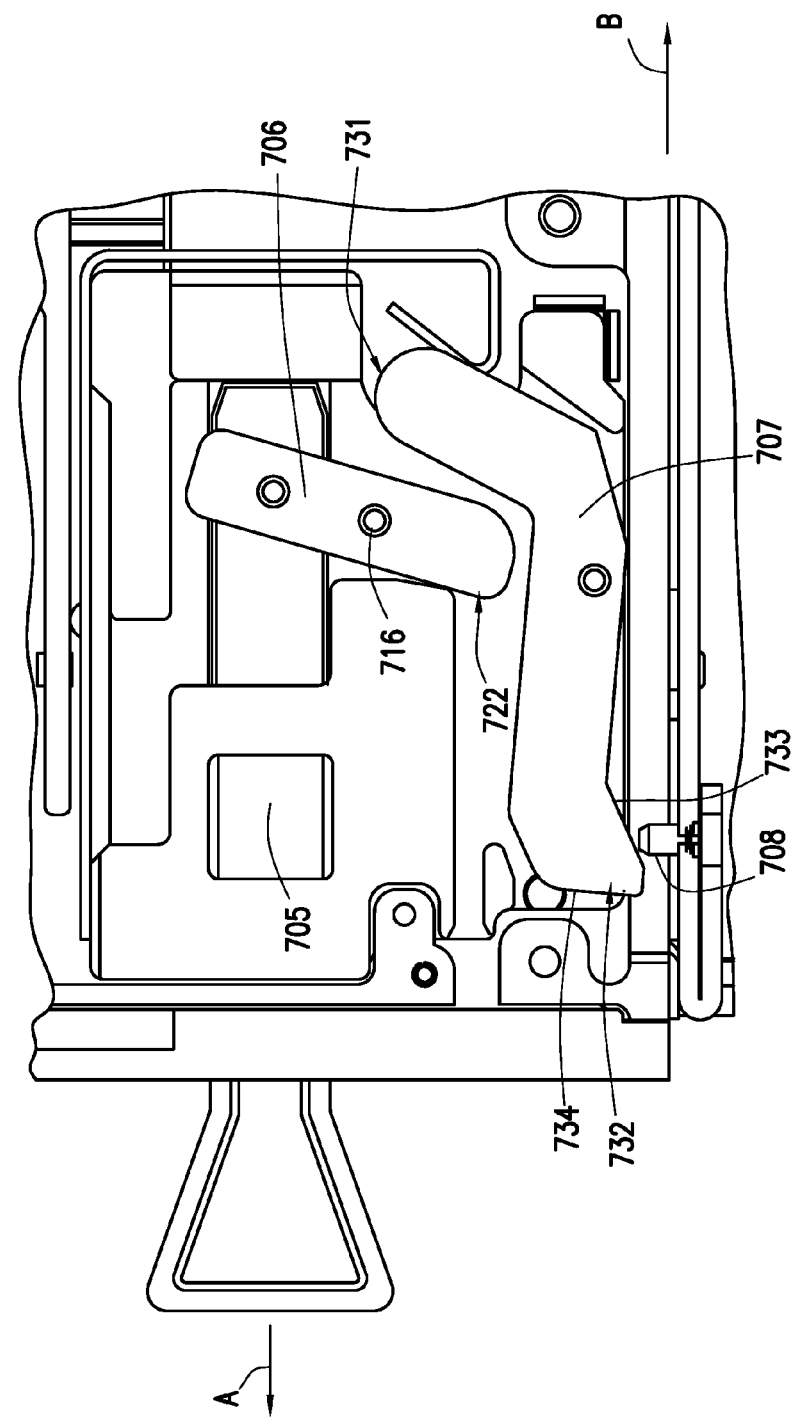

FLASH MODULE

CROSS-REFERENCE TO RELATED APPLICATIONS

Pursuant to 35 U.S.C. § 120 this application is a continuation of U.S. patent application Ser. No. 14/530,596, filed on Oct. 31, 2014, entitled "FLASH MODULE," which claims benefit of U.S. Provisional Application No. 62/005,787 filed on May 30, 2014, entitled "STORAGE ASSEMBLY SYSTEM." The disclosures of U.S. patent application Ser. No. 14/530,596 and U.S. Provisional Application No. 62/005,787 are incorporated herein by reference in their entirety.

BACKGROUND

Storage assembly systems may include flash modules. Flash modules may be mounted within a storage assembly system and may be used to store data. In particular, flash modules may include a solid-state disk or other electronic disks that may be used to store data.

BRIEF DESCRIPTION OF DRAWINGS

FIG. 3A shows a top view of a printed circuit board within a flash module in accordance with one or more embodiments of the invention.

FIG. 3B shows a side view of a printed circuit board within a flash module in accordance with one or more embodiments of the invention.

FIG. 3C shows a bottom view of a printed circuit board within a flash module in accordance with one or more embodiments of the invention.

FIG. 4A shows a top view of a flash module in accordance with one or more embodiments of the invention.

FIG. 4B shows a side view of a flash module in accordance with one or more embodiments of the invention.

FIG. 4C shows a first perspective view a flash module in accordance with one or more embodiments of the invention.

FIG. 4D shows a second perspective view of a flash module in accordance with one or more embodiments of the invention.

FIG. 7B shows a top view of a latch assembly in an unlatched position in accordance with one or more embodiments of the invention.

DETAILED DESCRIPTION

Figure 1A:
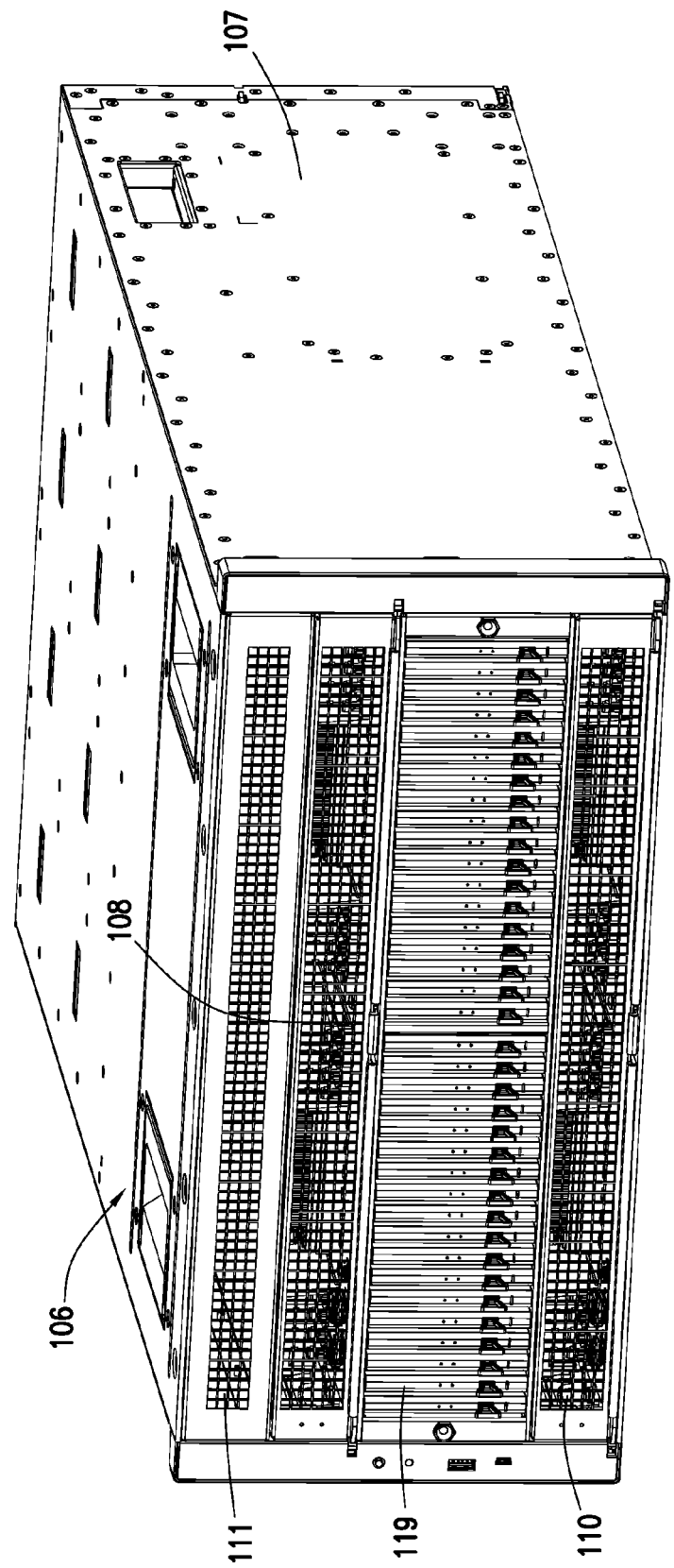
FIG. 1A shows a perspective view of a storage assembly system in accordance with embodiments of the invention.

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In the following description of FIGS. 1-7D, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

In one aspect, embodiments disclosed herein relate generally to a flash module. More specifically, one or more embodiments disclosed herein may be directed to one or more components of a flash module. For example, one or more embodiments disclosed herein relate to a latch assembly that may be used in a flash module to controllably secure the flash module within a storage assembly.

Although one or more of these embodiments may be preferred, the embodiments disclosed should not be interpreted, or otherwise used, as limiting the scope of the disclosure, including the claims. In addition, those skilled in the art will appreciate that the following description has broad application, and the discussion of any embodiment is meant only to be exemplary of that embodiment, and not intended to suggest that the scope of the disclosure, including the claims, is limited to that embodiment.

Certain terms are used throughout the following description and claims to refer to particular features or components. As those skilled in the art will appreciate, different persons may refer to the same feature or component by different names. This document does not intend to distinguish between components or features that differ in name but not function. The figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first component is coupled to a second component, that connection may be through a direct connection, or through an indirect connection via other components, devices, and connections.

Figure 1B:
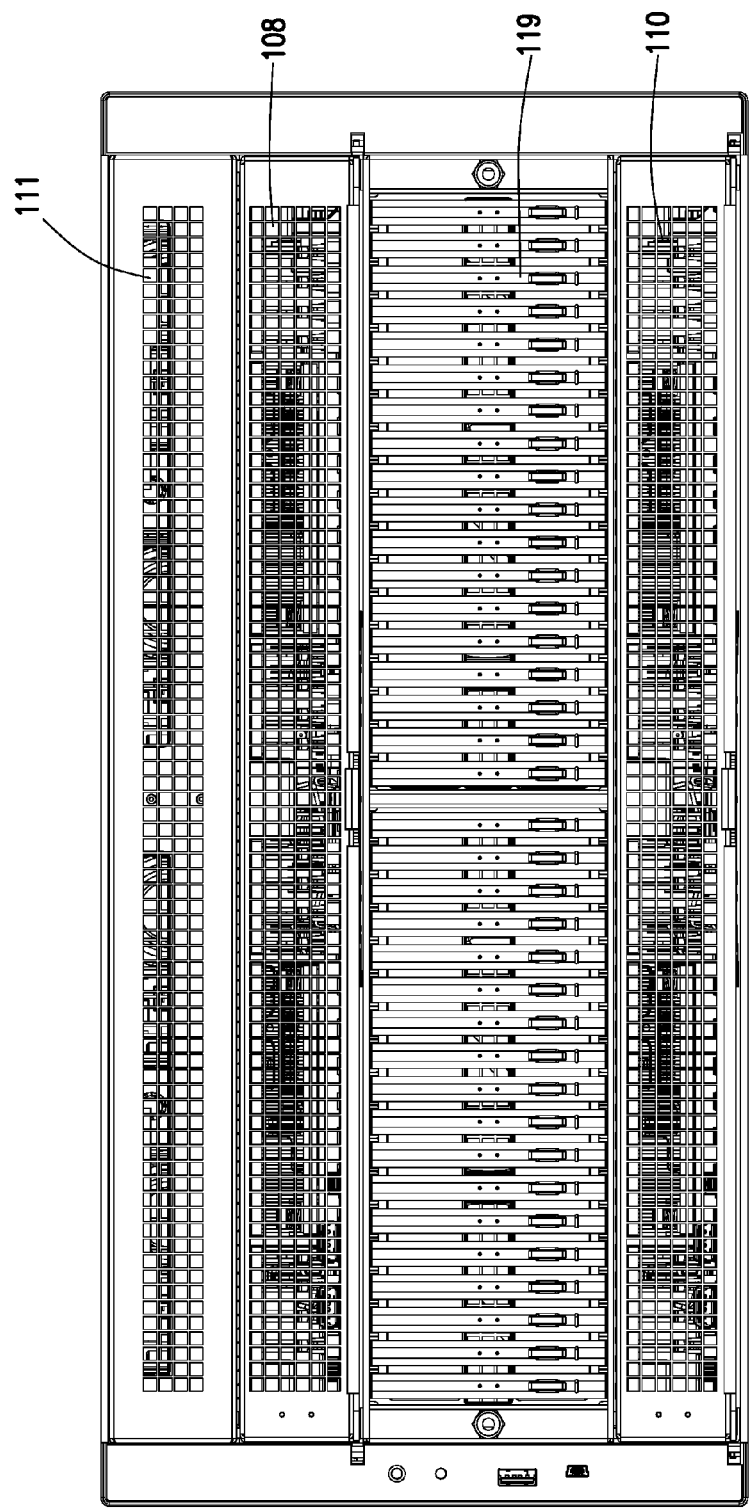
FIG. 1B shows a front view of a storage assembly system in accordance with embodiments of the invention.
Figure 1C:
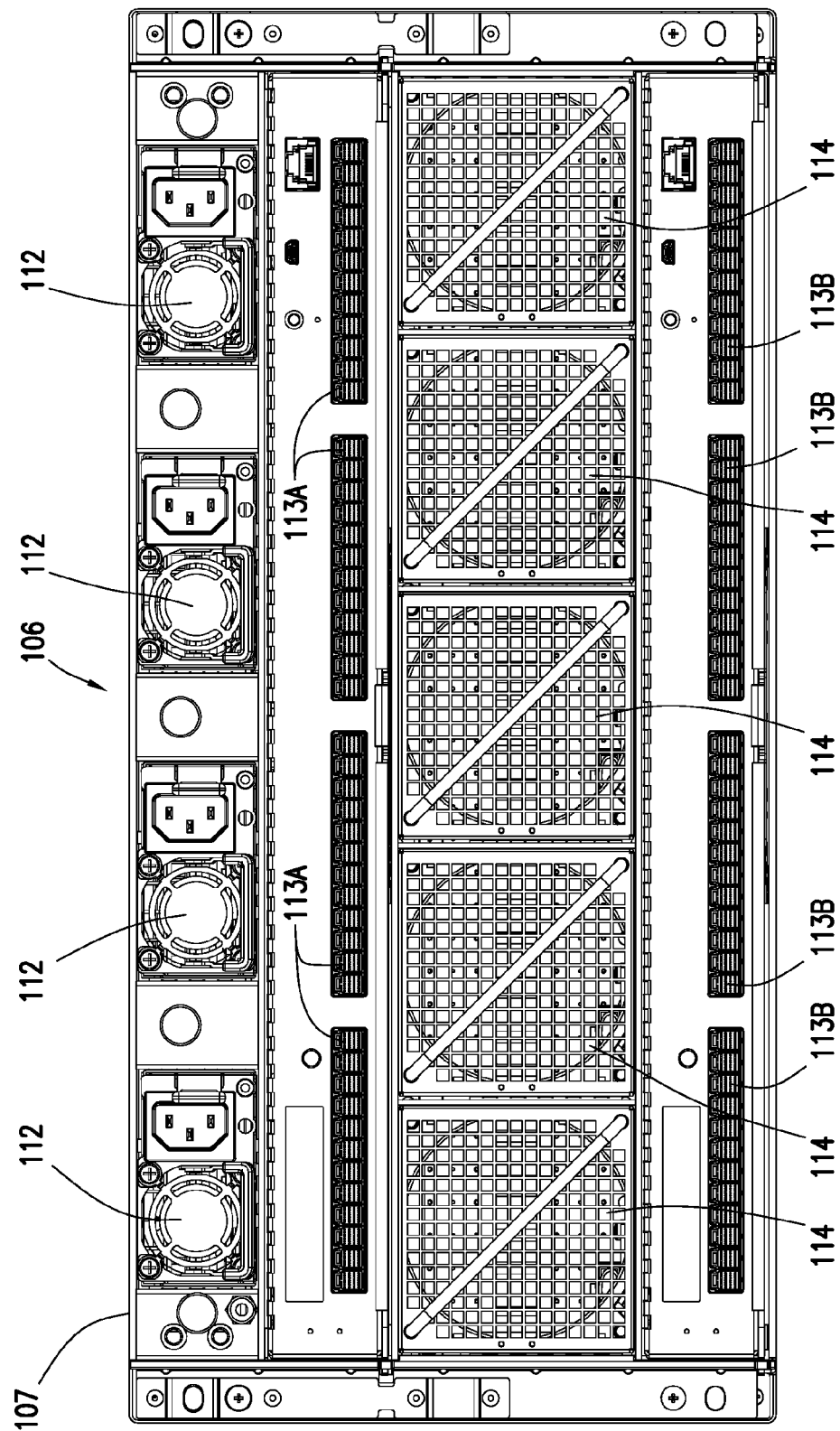
FIG. 1C shows a back view of a storage assembly system in accordance with embodiments of the invention.
Figure 1D:
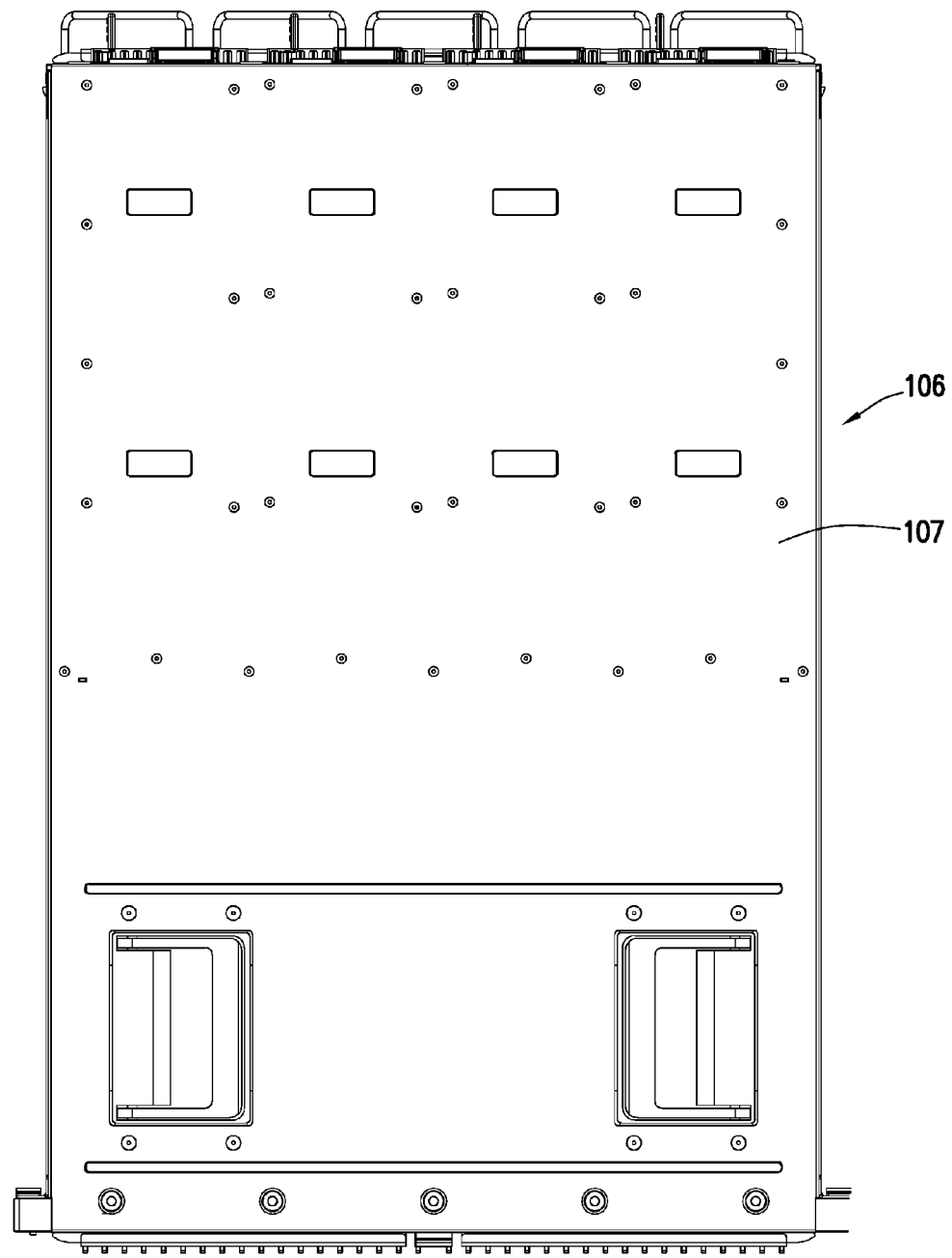
FIG. 1D shows a top view of a storage assembly system in accordance with embodiments of the invention.
Figure 1E:
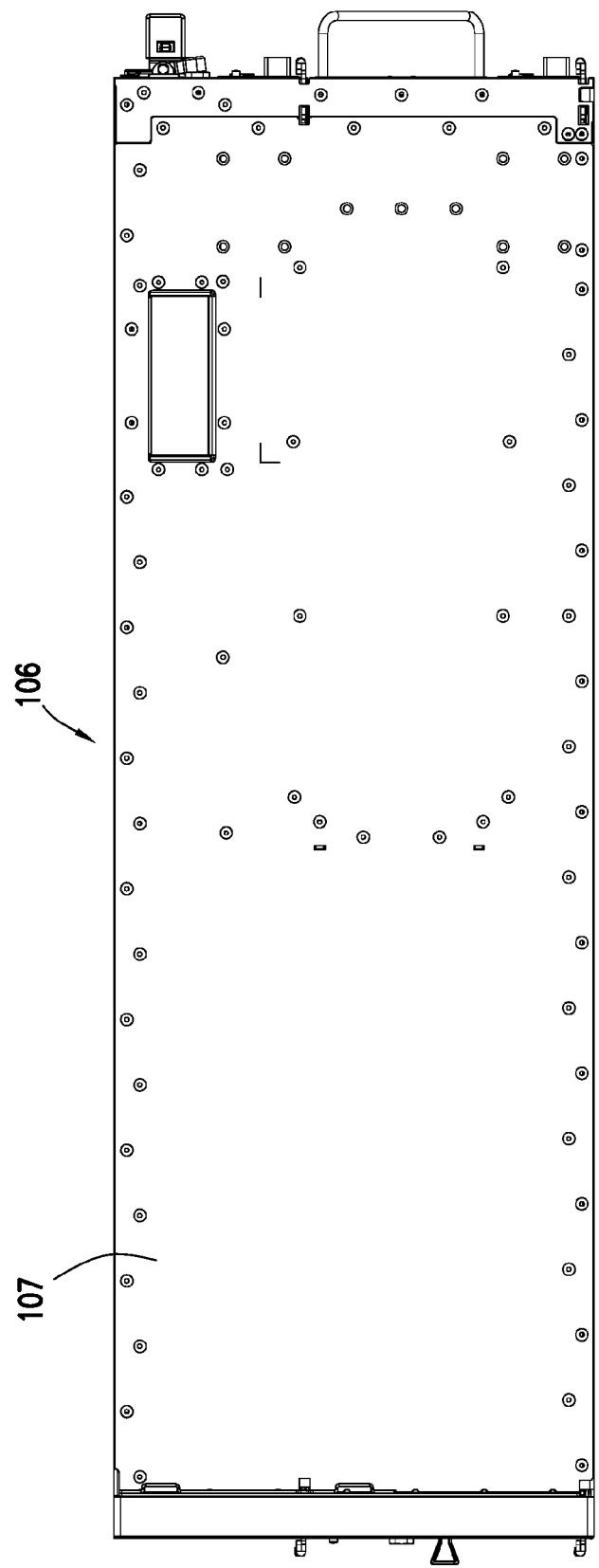
FIG. 1E shows a side view of a storage assembly system in accordance with embodiments of the invention.

Referring to FIGS. 1A-1E, multiple views of a storage assembly system (106) in accordance with embodiments disclosed herein are shown. FIG. 1A shows a perspective view of the storage assembly system (106), FIG. 1B shows a front view of the storage assembly system (106), FIG. 1C shows a back view of the storage assembly system (106), FIG. 1D shows a top view of the storage assembly system (106), and FIG. 1E shows a side view of the storage assembly system (106).

In one or more embodiments, the storage assembly system (106) may include a chassis (107), in which one or more components may be disposed and secured within. For example, as shown in FIG. 1B, one or more flash modules (119) are disposed within a front portion of the chassis (107). In one or more embodiments, the one or more flash modules (119) may be engaged within the chassis (107) of the storage assembly system (106) (e.g., by a latch assembly, which will be discussed further below).

Further, as shown, one or more openings may be formed through the chassis (107) of the storage assembly system (106), in which the one or more openings may allow airflow through the chassis (107) of the storage assembly system (106). In one or more embodiments, the aforementioned openings formed through the chassis (107) may include an upper airflow chamber (108), a central airflow chamber (e.g., the chamber in which the flash modules (119) are disposed), and a lower airflow chamber (110). In one or more embodiments, structural arrangement of one or more internal components may allow airflow to be controllably directed from each of the upper airflow chamber (108) and the lower airflow chamber (110) into the central airflow chamber.

Furthermore, as shown in FIG. 1D, one or more fan modules (114) are disposed within a rear portion of the chassis (107). In one or more embodiments, the one or more flash modules (119) may be engaged within the chassis (107) of the storage assembly system (106) (e.g., by a latch assembly, which will be discussed further below). In one or more embodiments, the one or more fan modules (114) may be configured to pull air through the chassis (107) of the storage assembly system (106) (e.g., from a front portion of the chassis (107), through the chassis (107), and out the rear portion of the chassis (107), such as through the central airflow chamber). Further, as shown, the chassis (107) may include one or more upper connection ports (113A) and one or more lower connection ports (113B), which may be used to operatively connect with one or more external peripherals (not shown). Moreover, in one or more embodiments, the storage assembly system (106) may include one or more power supplies (112) disposed and engaged thereon. In one or more embodiments, the one or more power supplies (112) may supply power and may also pull air through the chassis (107) of the storage assembly system (106) (e.g., through a power supply airflow chamber (111)). Further, in one or more embodiments, the aforementioned openings may also include a power supply airflow chamber (111). In one or more embodiments, the power supply airflow chamber (111) may be isolated from each of the upper airflow chamber (108), the central airflow chamber, and the lower airflow chamber (110).

In one or more embodiments, the one or more flash modules (119) may be spaced apart when engaged within the chassis (107) of the storage assembly system (106) to allow airflow between one or more flash modules (119) into an interior of the chassis (107).

Figure 2:
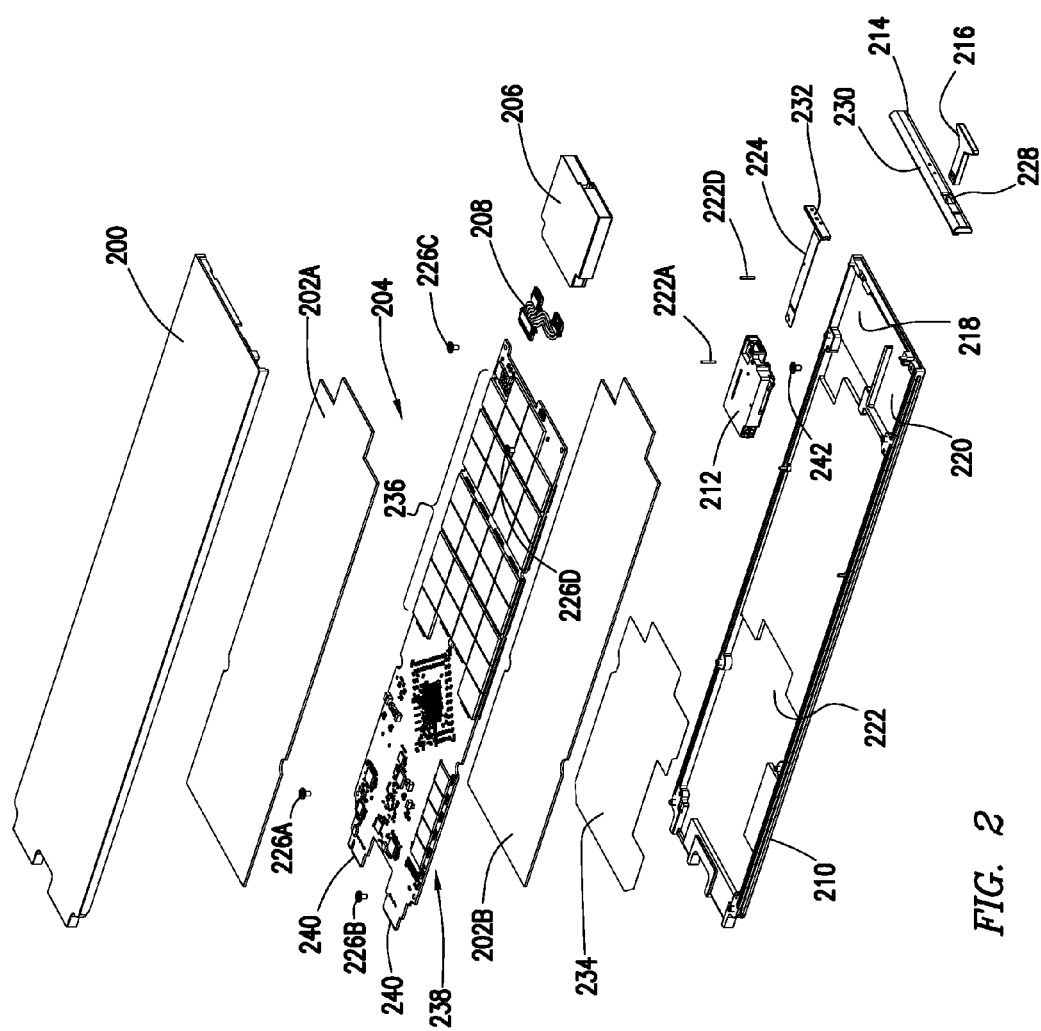
FIG. 2 shows an exploded view of a flash module in accordance with embodiments of the invention.

FIG. 2 shows an exploded view of a flash module in accordance with one or more embodiments of the invention. The flash module includes a top cover (200) and a bottom cover (210). The top cover (200) is in direct contact with a thermal interface material (TIM) (202A). In one embodiment of the invention, the TIM is a malleable material such as a silicon-based putty or gel. Other TIMs may be used without departing from the invention. The TIM (202A) is also in direct contact with all (or substantially all or a significant portion of) the components on the top surface of the printed circuit board (PCB) (204). For example, the TIM (202A) is in direct contact with the solid state storage (236; see also, 304B in FIG. 3A) and the memory (238). The TIM (202A), in one or more embodiments of the invention, is positioned within the flash module as to limit the air gaps between the components on the top surface of the PCB and the cover (200).

In one embodiment of the invention, solid state storage may include, but is not limited to, NAND Flash memory, NOR Flash memory, Magnetic RAM Memory (MRAM), Spin Torque Magnetic RAM Memory (ST-MRAM), Phase Change Memory (PCM), memristive memory, or any other memory defined as a non-volatile Storage Class Memory (SCM). Those skilled in the art will appreciate that embodiments of the invention are not limited to storage class memory.

In one embodiment of the invention, the memory (238) corresponds to any volatile memory including, but not limited to, Dynamic Random-Access Memory (DRAM), Synchronous DRAM, SDR SDRAM, and DDR SDRAM.

In one embodiment of the invention, the TIM (202A) does not extend over the super capacitor assembly (206), the cable assembly (208) that connects the PCB (204) to the super capacitor assembly (206), or the latch assembly (212) (e.g., described in FIGS. 5A-5D, 6A-6E, 7A-7D). The latch assembly (212) may be located within a cavity (220) within the bottom cover (210). In one embodiment of the invention, the latch assembly (212) includes the pull member (216). The specific design of the handle may change without departing from the invention. Further, the flash module may be implemented using other latch assemblies (i.e., a latch assembly other than the one shown in in FIGS. 5A-5D, 6A-6E, 7A-7D) without departing from the invention.

In one embodiment of the invention, the super capacitor assembly (206) includes a super capacitor enclosed in an insulator, e.g., a plastic insulator. The insulator surrounding the super capacitor is in direct contact with the top cover (200) and the bottom cover (210). The flash module includes a controller (or series of controllers) (e.g., a hot-swap controller) that is configured to monitor voltage drops across the flash module. This functionality allows the flash module to detect when it is disconnected from a midplane of the chassis of a storage assembly. When the flash module is disconnected from the midplane, the components on the flash module (including components on the PCB) continue to receive power for a period of time in order to ensure that all data that is currently stored in the memory (or all data in memory that needs to be persistently stored) (238, 310A, 310B) is stored in solid state storage on the flash module. This functionality may ensure that no data is lost when the flash module is disconnected from power (e.g., disconnected from the midplane). The super capacitor is sized to ensure that there is sufficient power to enable the aforementioned functionality. The super capacitor may be included within a cavity (218) within the bottom cover (210).

In one embodiment of the invention, solid state storage is mounted on both the top surface of the PCB (see e.g., solid state storage (204)) and the bottom surface of the PCB (see e.g., FIG. 3C, 304A). In one embodiment of the invention, the total storage capacity of the solid state storage in a given flash module is between 2 TB-16 TB.

In one embodiment of the invention, the memory (see e.g., memory (238)) is mounted on both the top surface of the PCB and the bottom surface of the PCB (see e.g., FIG. 3C, 310B). In one embodiment of the invention, the total storage capacity of the memory in a given flash module is between 2-4 GB. The invention is not limited to the aforementioned memory size range. In one embodiment of the invention, the ratio of the storage capacity of the memory to the storage capacity of the solid state storage is 1:1000. The invention is not limited to the aforementioned ratio.

In one embodiment of the invention, the top and bottom covers of the flash module are made of Aluminum. However, those skilled in the art will appreciate that they may be made of any other material that functions to (i) dissipate heat and/or (ii) shield the internal components in the flash module from electromagnetic interference (EMI). In one embodiment of the invention, the top and bottom covers of the flash module act as heat sinks. The top and bottom covers may be made of other materials such as composites, alloys, or any other material that has high thermal conductivity. The selection of a specific material for the top and bottom cover of the flash module may vary based on the amount of heat the needs to be removed from the flash module. Further, while the flash module is described using a single material for the top and bottom covers, the top and bottom covers of the flash module may be made of different materials. Further, the materials used for a given cover may also be non-uniform such that one portion of a cover may be made of a first material and a second portion of the cover may be made of a second material.

In one embodiment of the invention, the PCB is attached to the bottom cover (210) via screws (e.g., 226A, 226B, 226C, and 226D).

In one embodiment of the invention, a heat spreader (234) is located between the bottom cover (210) and the TIM (202B). The heat spreader (234) may be made of any material that provides efficient heat dissipation in order to prevent any hotspots on the bottom cover as a result of the heat generated by the storage controller (see FIG. 3C, 302) that is mounted on the bottom surface of the PCB (310B). The heat spreader (234) may be made of, for example, carbon fiber. The heat spreader may use other materials without departing from the invention. The heat spreader (234) may be located in a cavity (222) within the bottom cover (210). The TIM (202B) is in direct contact with the heat spreader (222). The TIM (202B) may not be in contact with the latch assembly (212) or the super capacitor (206).

In one embodiment of the invention, the storage controller (302) includes functionality to service read requests to read data from the solid state storage and/or to service write requests to write data to the solid state storage. The storage controller includes a single or multi-channel architecture to access the memory (238). Further, the storage controller may implement and/or support single data rate (SDR), double data rate (DDR), and/or Quad data rate (QDR) transfers.

The TIM (202B) may be in direct contact with all (or substantially all or a significant portion of) the components on the bottom surface of the printed circuit board (PCB) (204). For example, the TIM (202B) may be in direct contact with the solid state storage (304A in FIG. 3C) and the memory (310B in FIG. 3C). The TIM (202B), in one or more embodiments of the invention, is positioned within the flash module as to limit the air gaps between the components on the bottom surface of the PCB and the cover (210).

The flash module may include a bezel (230) that connects to the top and bottom covers (200, 210) of the flash module. The bezel (230) may include a hole (228) through which a handle (216) may be inserted, where the handle (216) is part of the latch assembly (212). The bezel may also have a flat surface (214) that includes one or more indicator lights. The bezel may have a different geometry as compared to what is shown in FIG. 2 without departing from the invention. The bezel (230) may be positioned within the flash module using, e.g., a pin (222A), and may further be secured to the flash module using a screw (242).

The top and bottom covers of the flash module may be connected together by press fitting. Said another way, the top and bottom covers are pressed together to create the flash module. In such cases, there are no external fasteners are used to connect the top and bottom covers of the flash modules to each other. The lack of external fasteners may enable the flash module to be tamper resistant. In other embodiments of the invention, the top and bottom covers may be connected together using external fasteners including, but not limited to, screws, pins, epoxy (or other adhesive chemical compounds).

In one embodiment of the invention, the flash module is hot-swappable. This functionality is implemented by a hot-swap controller that is attached to either the top or bottom of the PCB. The hot-swap controller may be an implemented, using a general purpose processor, an application-specific integrated circuit (ASIC), a Field Programmable Gate Array (FPGA), or any other integrated circuit. In one embodiment of the invention, when the flash module is disconnected from the midplane, the hot-swap controller electrically isolates the flash module from the midplane and other components connected thereto. This enables all power that is discharged from the super capacitor to be used only to power the flash module and not to power other components external to the flash module.

The flash module may include an indictor (232) that includes one or more light emitting diodes (LEDs) (or other light sources). The LEDs may include provide a visual indication of the status and/or whether the flash module is powered on. The LEDs may provide other status information without departing from the invention. The indicator (232) may receive power and signal information via a flex circuit (224).

Thought not shown in FIG. 2, the indicator (232) may also include a mechanical switch that interfaces with the latch assembly (212). When the handle (216) is pulled outward in order to remove the flash module from the chassis, the mechanical switch will be displaced (or otherwise moved) resulting in a signal being sent to the storage controller (302). The storage controller (302), upon receipt of the signal, triggers the transfer of all or a portion of the data currently stored in the memory (e.g., 238) to the solid state storage (236). The aforementioned mechanism may allow the storage controller additional time to transfer data from the memory to the solid state storage prior to the flash module being disconnected from the midplane. Once the flash module is disconnected from the midplane, components the flash module may continue to receive power from the super capacitor (described above) (206). In one embodiment of the invention, the mechanical switch may be implemented in embodiments in which the super capacitor is not able to discharge sufficient power, i.e., the super capacitor is not able to power the flash module for a period of time that is sufficient to ensure that all data (or all data that needs to be persistently stored) that is currently stored in the memory (238, 310A, 310B) is stored in solid state storage on the flash module.

In one embodiment of the invention, the flash module has the following dimensions: 80 mm×8.5 mm×304 mm (H×W×D). The flash module is not limited to the aforementioned dimensions. The depth of the flash module may correspond to the distance between the front of the chassis and the midplane. The flash module width may be designed such that 36 flash modules can be concurrently inserted within a chassis. The height of the flash module may be 2U (or substantially 2U).

The flash module also includes two 4x Peripheral Component Interconnect Express (PCIe) connectors (240). The two 4x PCIe connectors enable the flash module to connect to the midplane. Once a flash module is connected to the midplane the flash module may communicate via the midplane with one or more other components that are also connected to the midplane.

In other embodiments of the invention the flash module may implement connectors that conform with one or more of the following protocols: Peripheral Component Interconnect (PCI), PCI-eXtended (PCI-X), Non-Volatile Memory Express (NVMe), Non-Volatile Memory Express (NVMe) over a PCI-Express fabric, Non-Volatile Memory Express (NVMe) over an Ethernet fabric, and Non-Volatile Memory Express (NVMe) over an Infiniband fabric. Those skilled in the art will appreciate that the invention is not limited to the aforementioned protocols.

While the above description indicates that screws are used to affix the PCB to the bottom cover of the flash module, other connecting means may be used in place of screws. The other connecting means may include pins, epoxy, springs, or other physical components or adhesive chemical compounds that may be used to affix the PCB to the bottom cover within the flash module.

Though not described above, those skilled in the art will appreciate that the PCB may include other components mounted thereon.

FIG. 3A shows a top view of a printed circuit board within a flash module in accordance with one or more embodiments of the invention. As shown in FIG. 3A, the top surface of the PCB (300A) includes solid state storage (304B) and memory (310A). In addition, the PCIe connectors (308A, 308B) are integrated into an end portion of the PCB.

FIG. 3B shows a side view of a printed circuit board within a flash module in accordance with one or more embodiments of the invention. As shown in FIG. 3B, the side view of the PCB (300) shows the presence of solid state storage on both the top surface and bottom surface of the PCB (304A, 304B). Further, as shown in FIG. 3B, the PCIe connectors (308) are integrated into the end of the PCB and the storage controller (302) on the bottom surface of the PCB.

FIG. 3C shows a bottom view of a printed circuit board within a flash module in accordance with one or more embodiments of the invention. As shown in FIG. 3C, the bottom surface of the PCB (300B) includes solid state storage (304A) and memory (310B). In addition, the PCIe connectors (308A, 308B) are integrated into an end portion of the PCB.

Referring to FIGS. 4A-4D, multiple views of a flash module in accordance with embodiments disclosed herein are shown. FIG. 4A shows a top view of a flash module in accordance with one or more embodiments of the invention, FIG. 4B shows a side view of a flash module in accordance with one or more embodiments of the invention, FIG. 4C shows a first perspective view a flash module in accordance with one or more embodiments of the invention, and FIG. 4D shows a second perspective view of a flash module in accordance with one or more embodiments of the invention.

As shown, the flash module may include a housing and a pull member (216), the housing including a top cover (200) and a bottom cover (210). In one or more embodiments, the housing may have an opening and an inner cavity formed therein (e.g., between the top cover (200) and the bottom cover (210), and a portion of the pull member (216) may be disposed within the housing. The flash module may be disposed within a storage assembly (not shown), such as a storage chassis. A latch assembly, which will be discussed in further detail below, may allow the flash module to be secured within the storage assembly, while allowing a user to controllably disengage the flash module from the storage assembly by pulling the pull member (216) away from the housing 103 of the flash module. The pull member (216) may be ergonomically formed to allow a user to pull the pull member (216) away from the housing of the flash module. For example, in one or more embodiments, a portion of the pull member (216) may be substantially "T" shaped or may include an opening formed therethrough, which may allow a user to grip the pull member (216).

FIG. 4A shows a top view of a flash module in accordance with one or more embodiments of the invention. As shown in FIG. 4A, the PCIe connectors (308A, 308B) extend past the edge of the top cover (200). In one embodiment of the invention, this permits the PCIe connectors to be connected into the midplane (not shown). Once the PCIe connectors are connected to the midplane, the edge of the top cover (200) is in direct contact with the an EMI gasket(s) and/or a metal stiffener thereby continuing the electromagnetic interference shielding of the flash module. Further, the pull member (216) extends past the end of the bezel (214).

Those skilled in the art will appreciate that the specific geometry of the curved portions of the flash module (e.g., the curved portions near the PCIe connectors (308B)) may have different geometries without departing from the invention. Further, the spacing between the PCIe connectors (308A, 308B) and/or the location of the PCIe connectors (308A, 308B) along with the end of the PCB (204 in FIG. 2) may also vary without departing from the invention.

FIG. 4B shows a side view of a flash module in accordance with one or more embodiments of the invention. As shown, the top cover (200) and the bottom cover (210) are press-fit together. Once press-fit together, the PCIe connectors (308) extend past the edge of the flash module covers (200, 210) and the pull member (216) extends past the end edge of the bezel. The bezel (214) may be attached once the top and bottom covers of the flash module are press-fit together.

FIGS. 4C-4D show perspective views of the flash module in accordance with one or more embodiments of the invention. As shown, the pull member (216) is located closer to bottom edge of the flash module when it is inserted into the chassis.

One or more aspects of the present disclosure is directed to a latch assembly. In one or more embodiments, the latch assembly of the present disclosure may be incorporated into a flash module and may be used to controllably secure the flash module within a storage assembly.

Figure 5A:
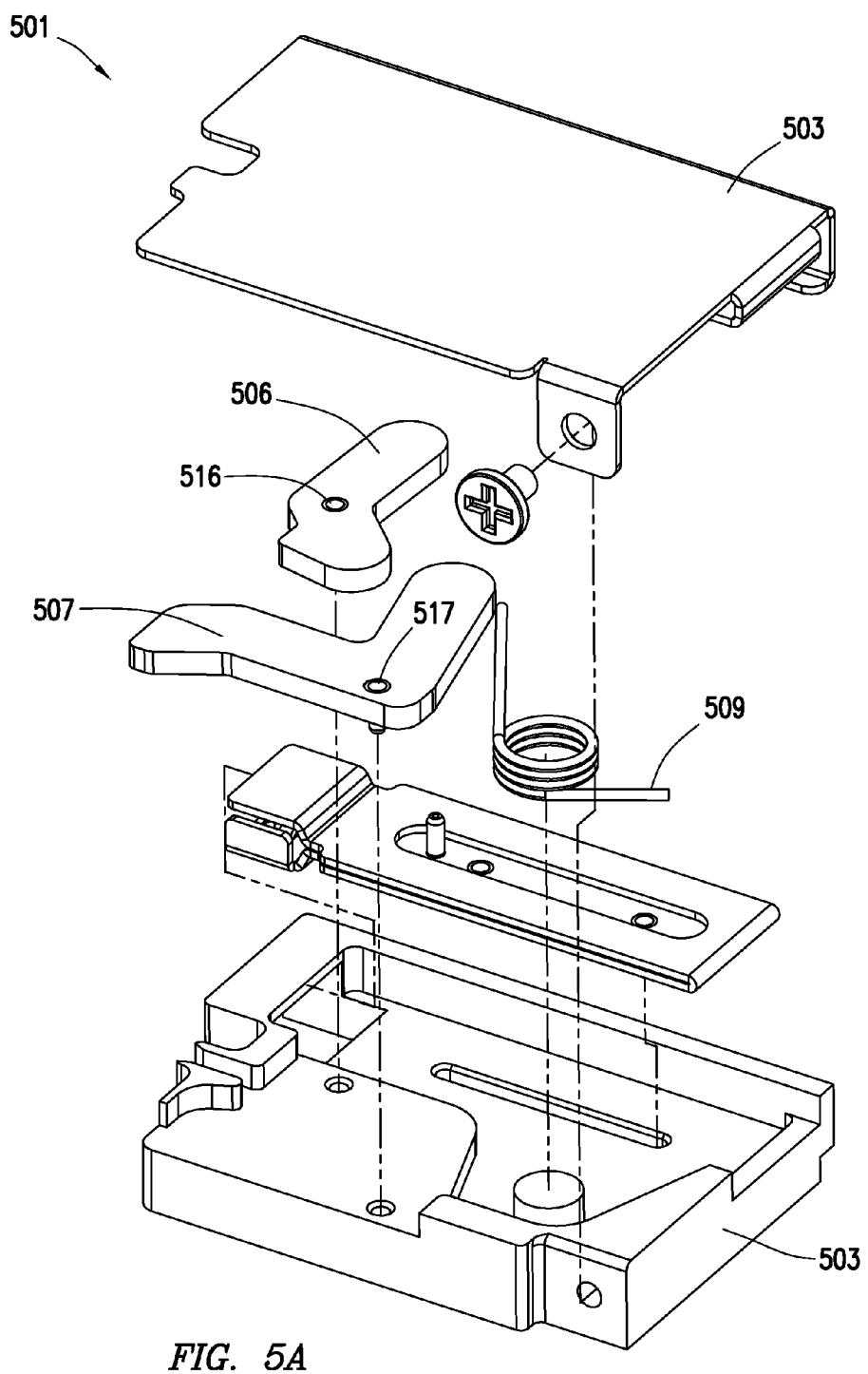
FIG. 5A is an exploded view of a latch assembly in accordance with one or more embodiments of the invention.

Referring now to FIG. 5A, an exploded view of a latch assembly (501) in accordance with embodiments disclosed herein is shown. In one or more embodiments, the latch assembly (501) may include a housing (503). The housing (503) of the latch assembly (501) may have an opening and an inner cavity formed therein, in which the inner cavity of the housing (503) is configured to receive one or more components, which will be discussed below.

Figure 5B:
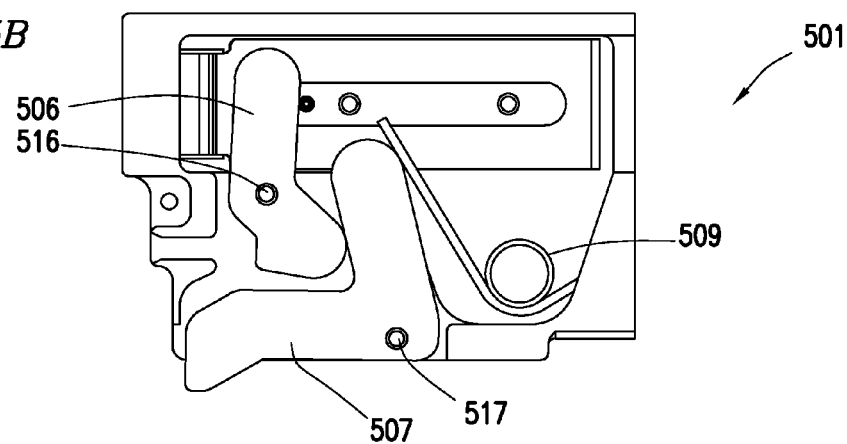
FIG. 5B is a top view of a latch assembly in accordance with one or more embodiments of the invention.
Figure 5C:
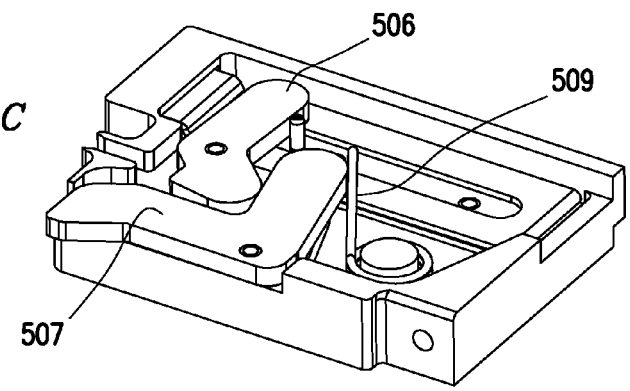
FIG. 5C is a perspective view of a latch assembly in accordance with one or more or more embodiments of the invention.
Figure 5D:
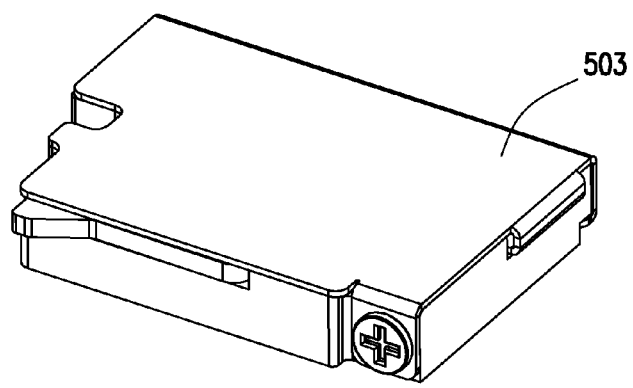
FIG. 5D is a perspective view of a latch assembly and a cover disposed thereon in accordance with one or more embodiments of the invention.

Further, as shown in FIGS. 5B-5D, the latch assembly (501) may include a reversing link (506) disposed within the housing (503). FIG. 5B is a top view of a latch assembly in accordance with one or more embodiments of the invention, FIG. 5C is a perspective view of a latch assembly in accordance with one or more or more embodiments of the invention, and FIG. 5D is a perspective view of a latch assembly and a housing (503) disposed thereon in accordance with one or more embodiments of the invention.

In one or more embodiments, the reversing link (506) may be pivotally coupled to the housing (503) about a pivot point (516). Further, in one or more embodiments, the latch assembly (501) may include a latch member (507) disposed within the housing (503). In one or more embodiments, the latch member (507) may be pivotally coupled to the housing (503) about a pivot point (517). Furthermore, one or more embodiments of the latch assembly (501) may include a torsion spring (509) also disposed within the housing (503), in which the torsion spring (509) may engage a portion of the latch member (507) and exert a spring force on the portion of the latch member (507).

Figure 6A:
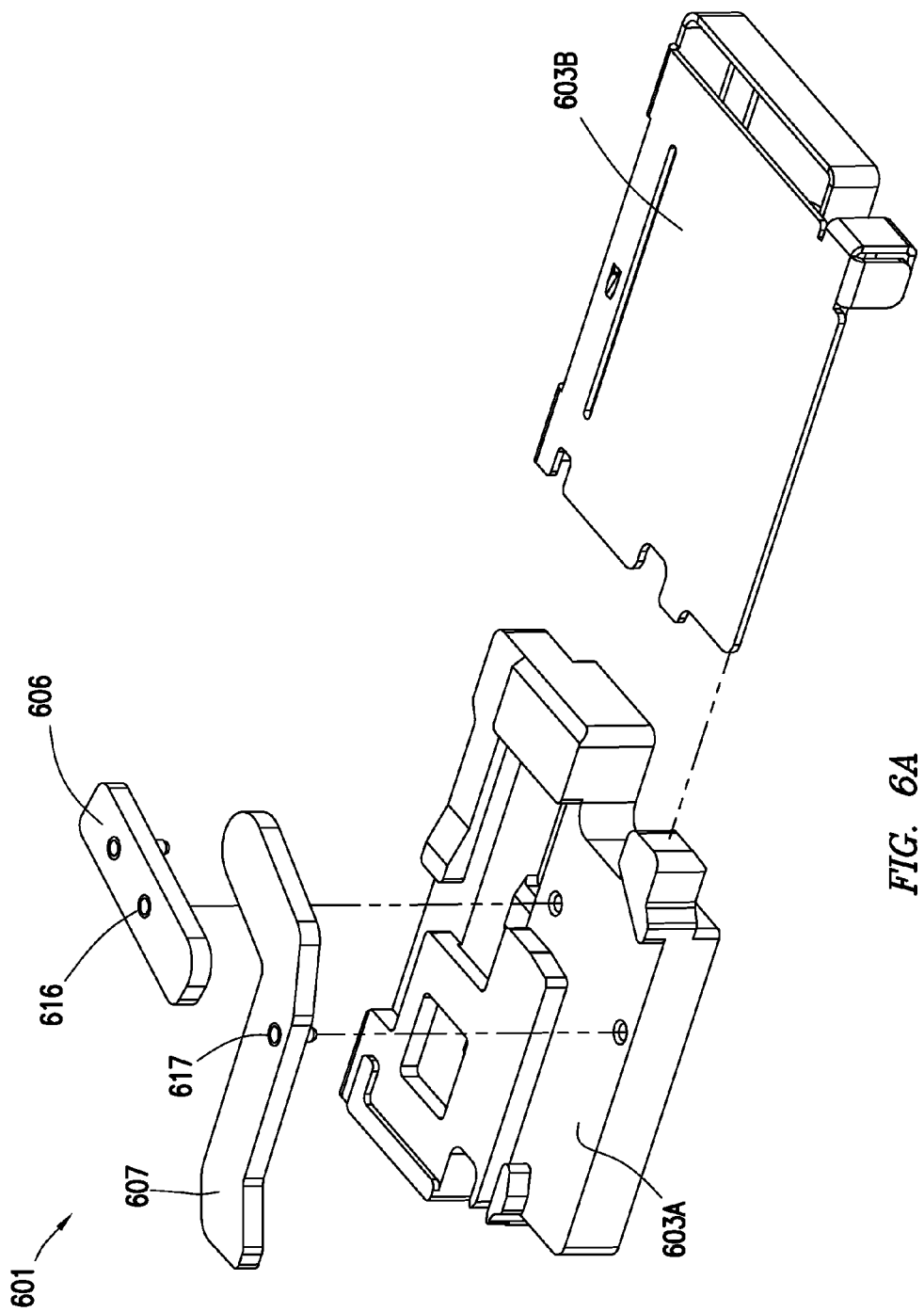
FIG. 6A shows an exploded view of a latch assembly in accordance with embodiments disclosed herein.

Referring now to FIG. 6A, an exploded view of a latch assembly (601) in accordance with embodiments disclosed herein is shown. In one or more embodiments, the latch assembly (601) may include a housing. As shown, the housing of the latch assembly (601) includes a first portion 603A and a second portion (603B). In one or more embodiments, the first portion (603A) and the second portion (603B) may be coupled together, and an opening and an inner cavity may be formed between the first portion (603A) and the second portion (603B) of the housing. The inner cavity formed between the first portion (603A) and the second portion (603B) of the housing may be configured to receive one or more components (e.g., the reversing link (506), the latch member (507), and/or the torsion spring (509) discussed above).

Figure 6B:
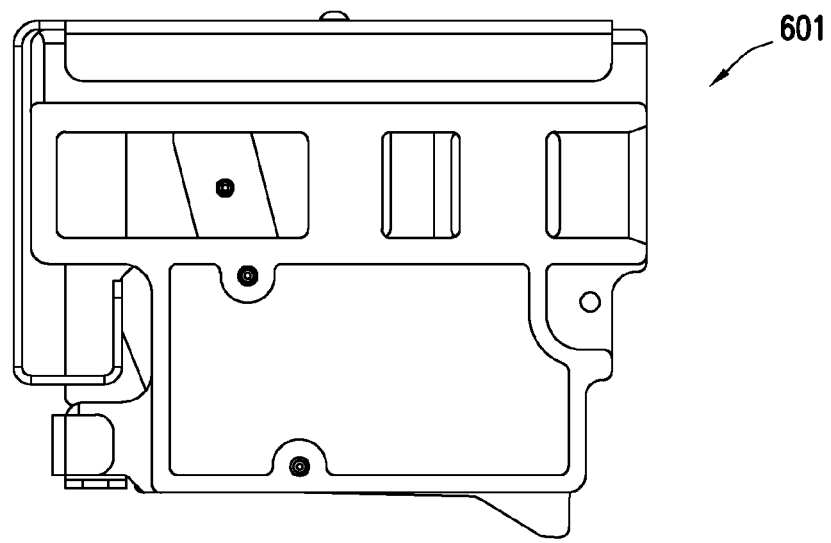
FIG. 6B shows a bottom view of a latch assembly in accordance with embodiments one or more embodiments of the invention.
Figure 6C:
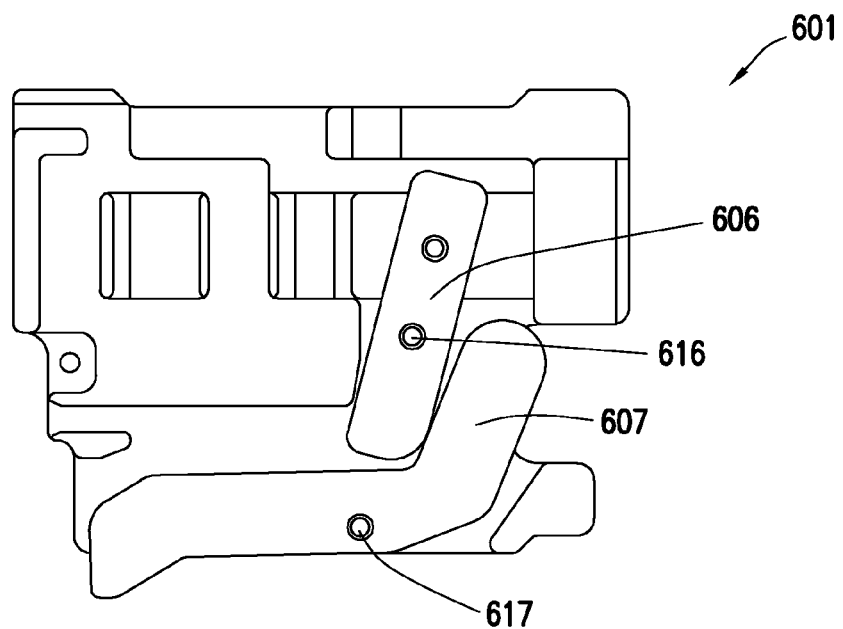
FIG. 6C shows a top view of a latch assembly in accordance with one or more embodiments of the invention.
Figure 6D:
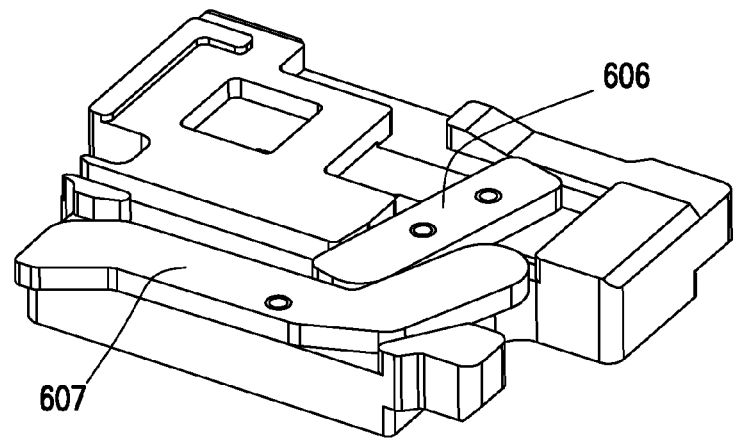
FIG. 6D shows a perspective view of a latch assembly in accordance with one or more embodiments of the invention.
Figure 6E:
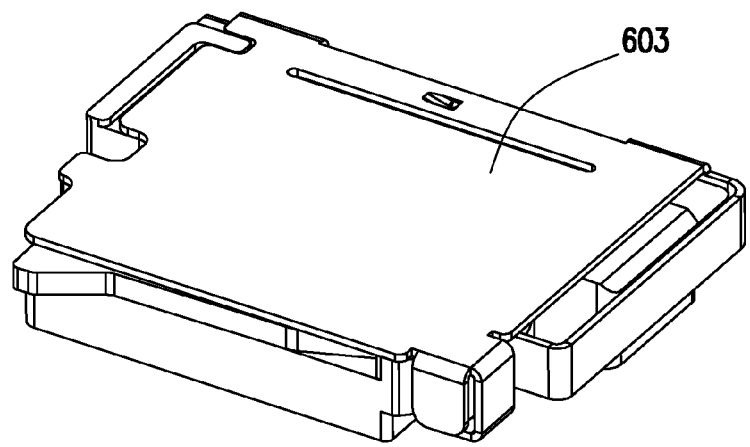
FIG. 6E shows a perspective view of a latch assembly and a cover disposed thereon in accordance with one or more embodiments of the invention.

As shown in FIGS. 6B-6E, the latch assembly (601) may include a reversing link (606) disposed within the housing. FIG. 6B shows a bottom view of a latch assembly in accordance with embodiments one or more embodiments of the invention, FIG. 6C shows a top view of a latch assembly in accordance with one or more embodiments of the invention, FIG. 6D shows a perspective view of a latch assembly in accordance with one or more embodiments of the invention, and FIG. 6E shows a perspective view of a latch assembly and a cover disposed thereon in accordance with one or more embodiments of the invention In one or more embodiments, the reversing link (606) may be pivotally coupled to the first portion (603A) of the housing about a pivot point (616). Further, in one or more embodiments, the latch assembly (601) may include a latch member (607) disposed within the first portion (603A) of the housing. In one or more embodiments, the latch member (607) may be pivotally coupled to the first portion (603A) of the housing about a pivot point 617. Furthermore, one or more embodiments of the latch assembly (601) may include a return spring (not shown), which may be formed either on the first portion (603A) or the second portion (603B) of the housing, in which the return spring may engage a portion of the latch member (607) and exert a spring force on the portion of the latch member (607).

Figure 7A:
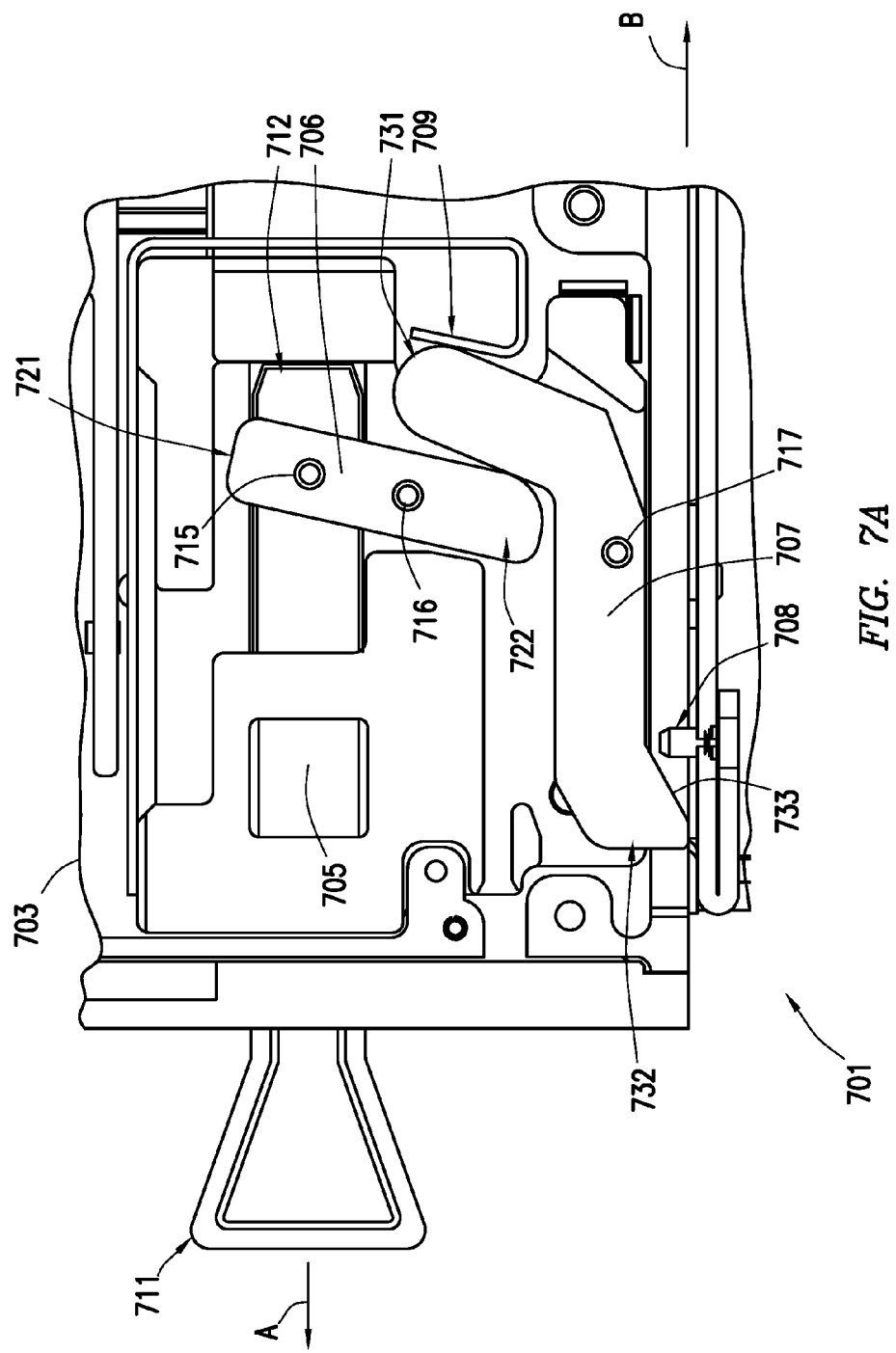
FIG. 7A shows a top view of a latch assembly in a latched position in accordance with one or more embodiments of the invention.
Figure 7C:
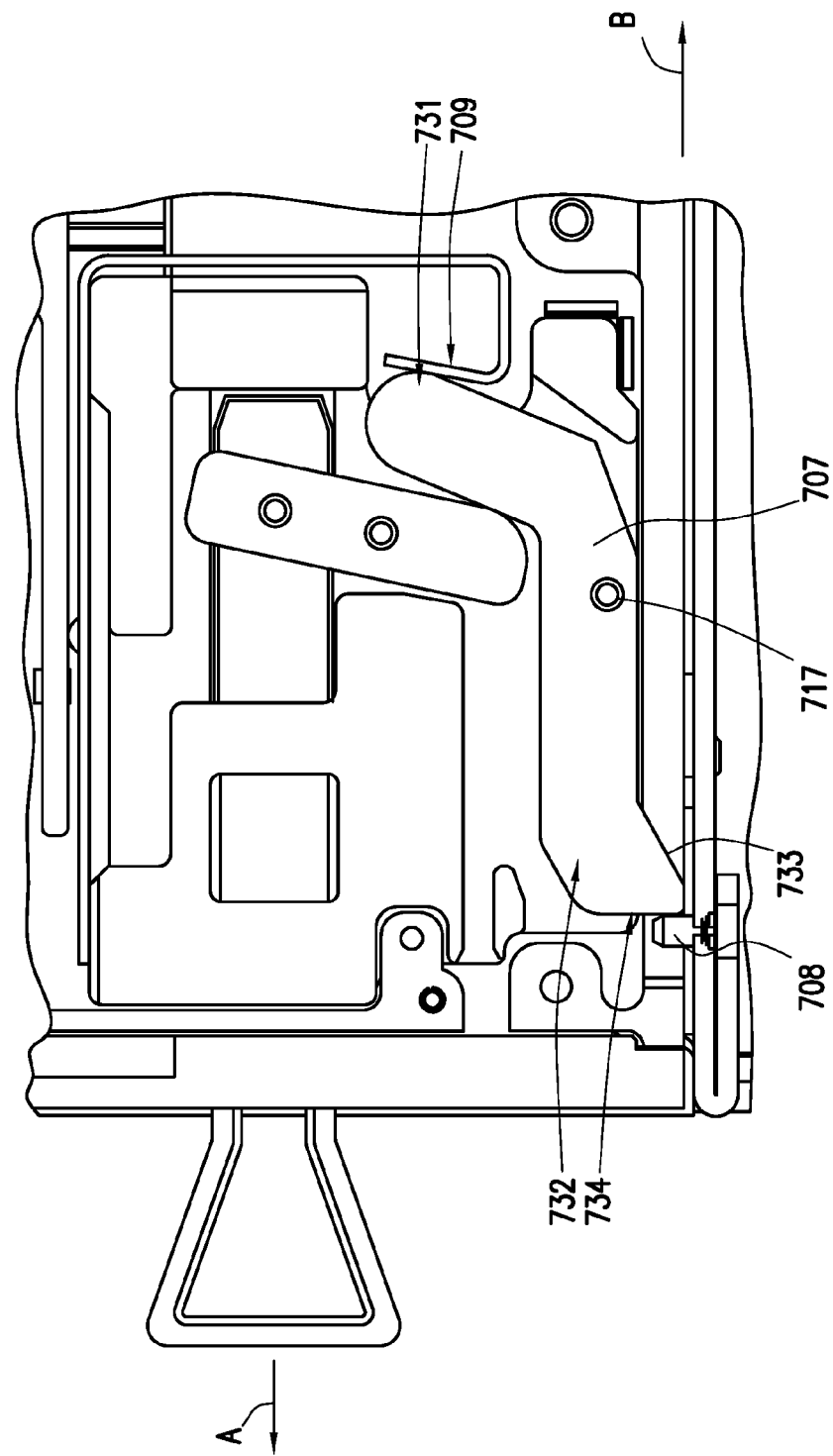
FIG. 7C shows a top view of a latch assembly in a latched position in accordance with one or more embodiments of the invention.
Figure 7D:
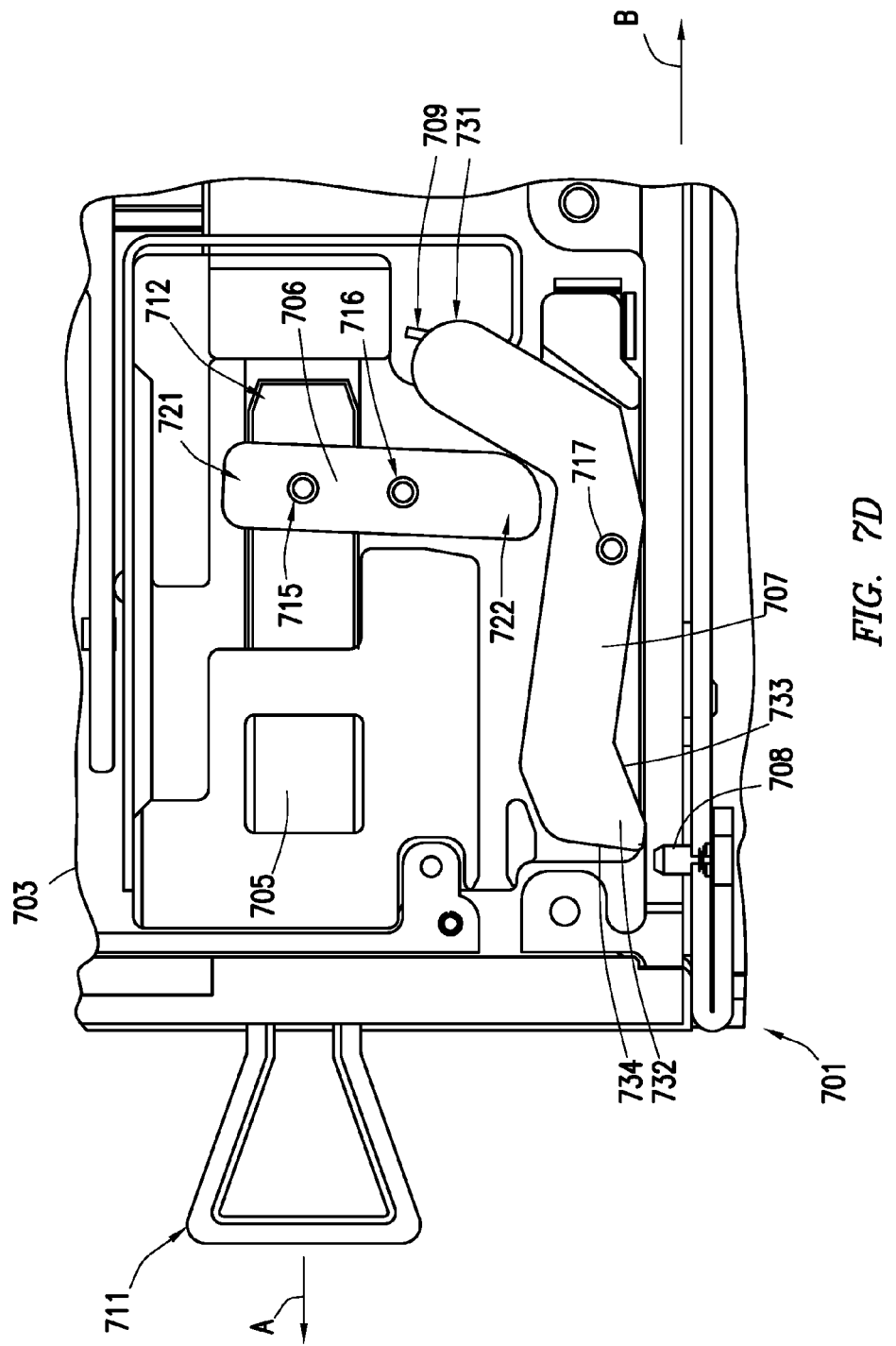
FIG. 7D shows a top view of a latch assembly in an unlatched position in accordance with one or more embodiments of the invention.

Referring generally to FIGS. 7A-7D, multiple views of a latch assembly (701) in accordance with embodiments disclosed herein are shown. FIG. 7A shows a top view of a latch assembly in a latched position in accordance with one or more embodiments of the invention, FIG. 7B shows a top view of a latch assembly in an unlatched position in accordance with one or more embodiments of the invention, FIG. 7C shows a top view of a latch assembly in a latched position in accordance with one or more embodiments of the invention, and FIG. 7D shows a top view of a latch assembly in an unlatched position in accordance with one or more embodiments of the invention.

In one or more embodiments, the latch assembly (701) may include a housing (703) having an opening and an inner cavity formed therein. Further, in one or more embodiments, the latch assembly (701) may include a pull member (705) having a first end (711) and a second end (712), in which the second end (712) of the pull member (705) is disposed within the housing (703). In one or more embodiments, the latch assembly (701) may also include a reversing link (706) having a first end (721) and a second end (722) disposed within the housing (703). In one or more embodiments, the first end (721) of the reversing link (706) is pivotally coupled to the second end (712) of the pull member (705) (e.g., about a pivot point (715)), and a portion of the reversing link (706) is pivotally coupled to the housing (703) (e.g., about a pivot point (716)).

Moreover, in one or more embodiments, the latch assembly (701) also includes a latch member (707) that is movable between a latched position and an unlatched position, the latch member (707) having a first end (731) and a second end (732). In one or more embodiments, the latch member (707) may be pivotally coupled to the housing (703) (e.g., about a pivot point (717)), and the second end (722) of the reversing link (706) may be configured to engage the first end (731) of the latch member (707).

Furthermore, in one or more embodiments, a retaining pin (708) may be coupled to a portion of a chassis. In one or more embodiments the retaining pin (708) may protrude into the inner cavity of the housing (703) of the latch assembly (701), and the second end (732) of the latch member (707) may be configured to engage the retaining pin (708).

One or more embodiments of the latch assembly (701) may also include a return spring (709). In one or more embodiments, the return spring (709) may be configured to engage the first end (731) of the latch member (707), in which the return spring (709) of the housing (703) may provide a biasing force to bias the latch member (707) toward the latched position.

As shown in FIG. 7B, the first end (731) of the latch member (707) may include an angled portion configured to engage the second end (722) of the reversing link (706) such that movement of the second end (722) of the reversing link (706) in a direction away from the pull member (705) may cause the latch member (707) to disengage from the retaining pin (708). For example, as shown in FIG. 7B, moving the pull member (705) in the direction of arrow B may cause the reversing link (706) to pivot about the pivot point (716) such that the second end (722) of the reversing link (706) disengages from the first end (731) of the latch member (707). Disengaging the second end (722) of the reversing link (706) from the first end (731) of the latch member (707) may allow the return spring (709) to bias the latch member (707) (e.g., the second end (732) of the latch member (707)) toward the latched position (e.g., in a direction toward the retaining pin (708)).

Still referring to FIG. 7B, in one or more embodiments, the second end (732) of the latch member (707) may be an angled portion including an angled surface (733) and a flat surface (734). In one or more embodiments, the angled surface (733) of the second end (732) of the latch member (707) may be configured to allow the latch member (707) to slide over the retaining pin (708) (e.g., in the direction of arrow B).

Referring now to FIG. 7C, the second end (732) of the latch member (707) may also include the flat surface (734), and the flat surface (734) of the second end (732) of the latch member (707) may be configured to prevent the latch member (707) from sliding over the retaining pin (708) (e.g., in the direction of arrow A) when the latch member (707) is in the latched position. The return spring (709) may bias the first end (731) of the latch member (707) (which may be an angled portion as discussed above) with a biasing force, which may bias the latch member (707) of the latch assembly (701) (e.g., the second end (732) of the latch member (707)) toward the latched position (e.g., in a direction toward the retaining pin (708)). FIG. 7C is an exemplary illustration of the latch assembly (701) in the latched position.

Referring now to FIG. 7D, in one or more embodiments, pulling the pull member (705) in the direction of arrow A (e.g., a user pulling on the first end (711) of the pull member (705)) may cause the first end (721) of the reversing link (706) to also move in the direction of arrow A, because the first end (721) of the reversing link (706) may be pivotally coupled to the second end (712) of the pull member (705) about the pivot point (715). Moving the first end (721) of the reversing link (706) in the direction of arrow A may cause the reversing link (706) to pivot about the pivot point (716) such that the second end (722) of the reversing link (706) to move in the direction of arrow B. Moving the second end (722) of the reversing link (706) in the direction of arrow B may cause the second end (722) of the reversing link (706) to engage the first end (731) of the latch member (707).

As discussed above, in one or more embodiments, the first end (731) of the latch member (707) may include an angled portion, and the return spring (709) may provide a biasing force to bias the latch member (707) toward the latched position. However, pulling the pull member (705) in the direction of arrow A (e.g., a user pulling on the first end (711) of the pull member (705)) with sufficient force to overcome the biasing force of the return spring (709) on the latch member (707) may cause the second end (722) of the reversing link (706) to engage the angled portion of the first end (731) of the latch member (707) and may cause the latch member (707) to pivot about the pivot point (717) and may move the second end (732) of the latch member (707) toward the disengaged position (e.g., in a direction away from the retaining pin (708)).

In one or more embodiments, moving the second end (732) of the latch member (707) toward the disengaged position may disengage the flat portion 734 of the second end (732) of the latch member (707) from the retaining pin (708). Disengaging the flat portion (734) of the second end (732) of the latch member (707) from the retaining pin (708) may allow the latch member (707) to move past the retaining pin (708) (e.g., in the direction of arrow A) and may allow a flash module (e.g., the flash module 100 shown in FIG. 1) to be removed from a storage assembly (not shown). FIG. 7D is an exemplary illustration of the latch assembly (701) in the unlatched position.

While the disclosure includes a limited number of embodiments, those skilled in the art, having benefit of this disclosure, will appreciate that other embodiments may be devised which do not depart from the scope of the disclosure. Although only a few example embodiments have been described in detail above, those skilled in the art will readily appreciate that many modifications are possible in the example embodiments without materially departing from this invention. Accordingly, all such modifications are intended to be included within the scope of this disclosure.

What is claimed is:

1. A system, comprising:
    a flash module, comprising:
        a top cover and a bottom cover;
        a printed circuit board (PCB) comprising memory, solid state storage, a storage controller configured to manage the memory and the solid state storage, and at least one integrated connector;
        a capacitor, wherein the capacitor is configured to power at least the storage controller when the flash module is disconnected from an external power source; and
        a latch assembly, comprising:
            a housing having an opening and an inner cavity formed therein;
            a pull member having a first end and a second end, wherein the second end of the pull member is disposed within the housing;
            a reversing link having a first end and a second end disposed within the housing, wherein the first end of the reversing link is pivotally coupled to the second end of the pull member and a portion of the reversing link is pivotally coupled to the housing; and
            a latch member movable between a latched position and an unlatched position, the latch member having a first end and a second end disposed within the housing, wherein the latch member is pivotally coupled to the housing and the second end of the reversing link is configured to engage the first end of the latch member; and
    a chassis having an opening formed therein, the opening configured to receive the flash module, the chassis comprising:
        a retaining pin coupled to the housing, wherein the retaining pin protrudes into the inner cavity of the housing and the second end of the latch member is configured to engage the retaining pin.

2. The system of claim 1, wherein the first end of the latch member comprises an angled portion of the latch member configured to engage the second end of the reversing link such that movement of the second end of the reversing link in a direction away from the pull member causes the latch member to disengage from the retaining pin of the chassis.

3. The system of claim 1, wherein the second end of the latch member is an angled portion of the latch member comprising an angled surface and a flat surface.

4. The system of claim 3, wherein the angled surface of the second end of the latch member is configured to allow the latch member to slide over the retaining pin of the chassis, and wherein the flat surface of the second end of the latch member is configured to prevent the latch member from sliding over the retaining pin of the chassis.

5. The system of claim 1, wherein the housing comprises a return spring configured to engage the first end of the latch member, wherein the return spring of the housing provides a biasing force to bias the latch member to the latched position.

6. The system of claim 5, wherein overcoming the biasing force of the return spring by moving the first end of the pull member away from the housing causes the second end of the reversing link to engage the first end of the latch member and moves the latch member from the engaged position to the disengaged position.

7. The system of claim 1, further comprising a torsion spring disposed within the housing, wherein the torsion spring is configured to engage with the housing and the first end of the latch member, wherein the torsion spring provides a biasing force to bias the latch member to the latched position.

8. The system of claim 1, wherein moving the first end of the pull member toward the housing allows the latch member to slide over the retaining pin of the chassis.

* * * * *